United States Patent
Kim et al.

(10) Patent No.: US 12,265,419 B2
(45) Date of Patent: Apr. 1, 2025

(54) DISPLAY APPARATUS

(71) Applicant: SAMSUNG ELECTRONICS CO., LTD., Suwon-si (KR)

(72) Inventors: Yeonho Kim, Suwon-si (KR); Beomhan Kim, Suwon-si (KR); Dongjin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 17/894,702

(22) Filed: Aug. 24, 2022

(65) Prior Publication Data
US 2023/0168712 A1 Jun. 1, 2023

Related U.S. Application Data

(63) Continuation of application No. PCT/KR2022/012327, filed on Aug. 18, 2022.

(30) Foreign Application Priority Data

Nov. 30, 2021 (KR) ........................ 10-2021-0168000

(51) Int. Cl.
*G06F 1/16* (2006.01)
*G06F 1/20* (2006.01)
(Continued)

(52) U.S. Cl.
CPC .......... *G06F 1/1607* (2013.01); *G06F 1/1601* (2013.01); *G06F 1/20* (2013.01);
(Continued)

(58) Field of Classification Search
CPC ........ G06F 1/1601; G06F 1/1607; G06F 1/20; G02F 1/1333; G02F 2201/46;
(Continued)

(56) References Cited

U.S. PATENT DOCUMENTS 7,150,804 B2   12/2006   Tajima
7,931,771 B2    4/2011   Watanabe
(Continued)

FOREIGN PATENT DOCUMENTS

EP   1895386 A1 *   3/2008   ....... G02F 1/133308
EP   2159626 A1 *   3/2010   ........... G06F 1/1601
(Continued)

OTHER PUBLICATIONS

International Search Report (PCT/ISA/210) and Written Opinion (PCT/ISA/237) dated Dec. 15, 2022 issued by the International Searching Authority in International Application No. PCT/KR2022/012327.
(Continued)

*Primary Examiner* — Adrian S Wilson
*Assistant Examiner* — Gage Crum
(74) *Attorney, Agent, or Firm* — Sughrue Mion, PLLC

(57) ABSTRACT

A display apparatus includes: a display panel; a rear chassis covering a rear surface of the display panel; a support frame coupled to the rear chassis; a panel holder provided on the rear surface of the display panel to face the support frame, the panel holder being configured to be coupled to the support frame to attach the display panel to the rear chassis; and a wire configured to: couple the panel holder to the support frame based on the wire being coupled to the panel holder and the support frame, and release the coupling between the panel holder and the support frame based on the wire being separated from the panel holder and the support frame.

14 Claims, 26 Drawing Sheets

(51) Int. Cl.
  *H05K 5/00* (2006.01)
  *H05K 5/03* (2006.01)
  *H05K 7/20* (2006.01)

(52) U.S. Cl.
  CPC ............. *H05K 5/00* (2013.01); *H05K 5/03* (2013.01); *H05K 7/20* (2013.01); *H05K 7/20963* (2013.01); *G06F 2200/1612* (2013.01)

(58) Field of Classification Search
  CPC .. G02F 2201/465; H05K 5/03; H05K 5/0004; H05K 5/0017; H05K 5/0221; H05K 7/20; F16B 5/07; F16B 5/0692
  See application file for complete search history.

(56) References Cited

U.S. PATENT DOCUMENTS

| | | | |
|---|---|---|---|
| 7,948,742 B2 | 5/2011 | Kondo et al. | |
| 10,738,813 B2 | 8/2020 | Jung et al. | |
| 11,728,459 B2 | 8/2023 | Lee et al. | |
| 2006/0152905 A1* | 7/2006 | Kim | H05K 5/02 361/715 |
| 2014/0036162 A1* | 2/2014 | Sato | G06F 1/1652 348/836 |
| 2014/0340587 A1 | 11/2014 | Ejiri | |
| 2015/0029166 A1* | 1/2015 | Park | G06F 1/1641 345/184 |
| 2016/0353592 A1 | 12/2016 | Li et al. | |
| 2017/0159687 A1* | 6/2017 | Jung | G02F 1/133308 |
| 2019/0129234 A1* | 5/2019 | Eom | G06F 1/1601 |
| 2021/0168955 A1* | 6/2021 | Jeon | H05K 7/20963 |

FOREIGN PATENT DOCUMENTS

| | | |
|---|---|---|
| JP | 2007-79098 A | 3/2007 |
| JP | 2009-162869 A | 7/2009 |
| JP | 2013-156525 A | 8/2013 |
| JP | 5827189 B2 | 12/2015 |
| KR | 10-0560222 B1 | 3/2006 |
| KR | 10-0724917 B1 | 6/2007 |
| KR | 10-2007-0073971 A | 7/2007 |
| KR | 10-1947693 B1 | 5/2019 |
| KR | 10-2131661 B1 | 7/2020 |
| KR | 10-2020-0139379 A | 12/2020 |
| KR | 10-2021-0017498 A | 2/2021 |
| KR | 10-2021-0030024 A | 3/2021 |

OTHER PUBLICATIONS

Communication issued Nov. 27, 2024 by the European Patent Office in European Patent Application No. 22901503.7.

\* cited by examiner

FIG. 1
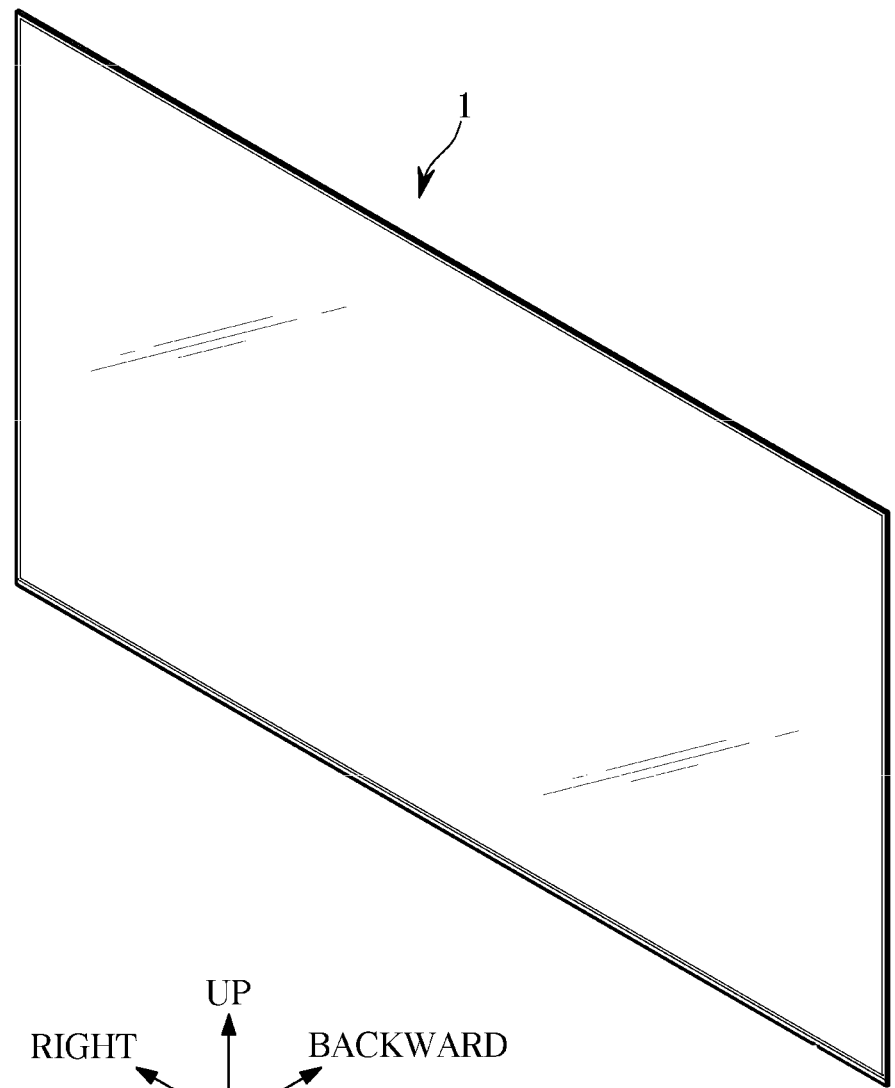
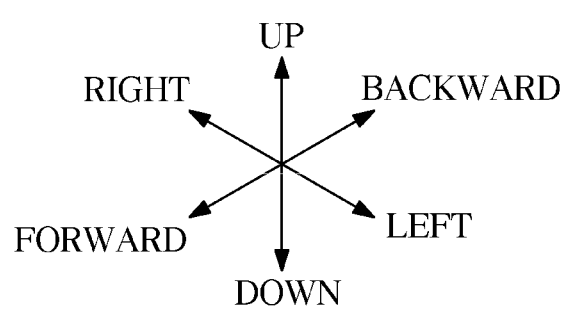

FIG. 2
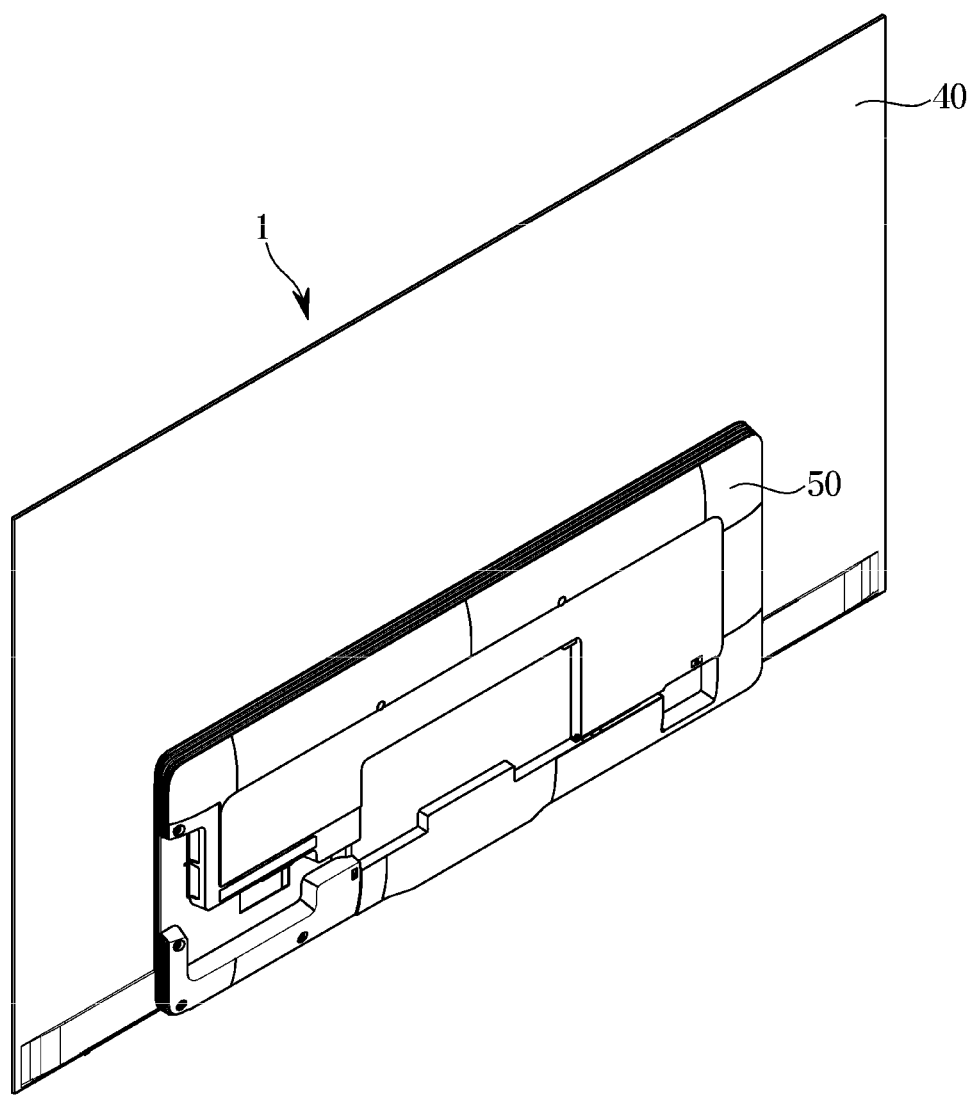
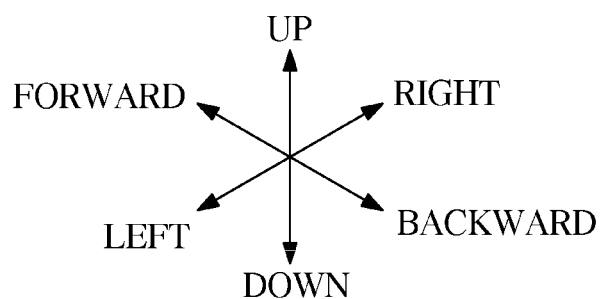

FIG. 4
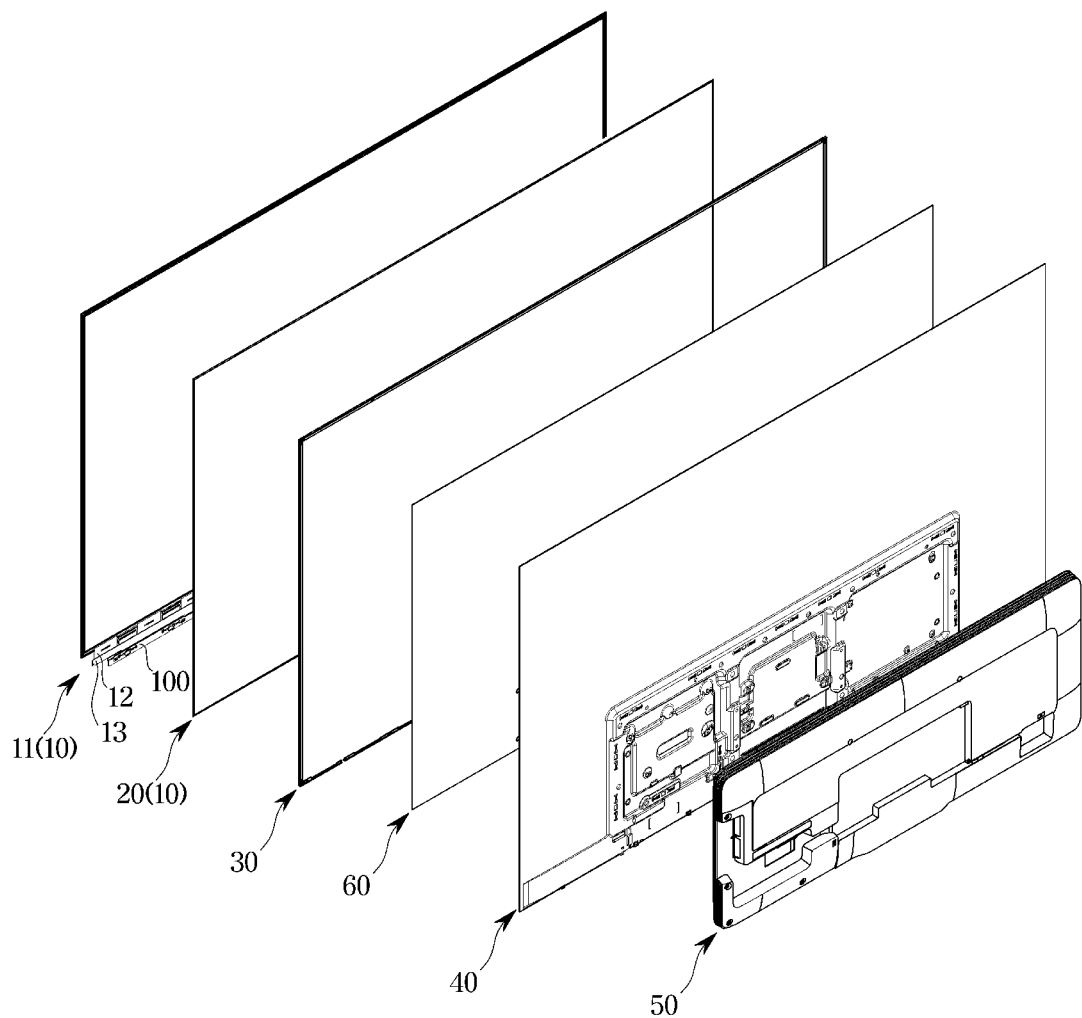
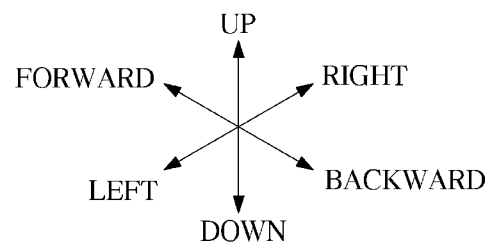

DISPLAY APPARATUS

CROSS-REFERENCE TO RELATED APPLICATION

This application is a bypass continuation of International Application No. PCT/KR2022/012327, filed on Aug. 18, 2022, which is based on and claims priority to Korean Patent Application No. 10-2021-0168000, filed on Nov. 30, 2021, the disclosures of which are incorporated by reference herein in their entireties.

BACKGROUND

1. Field

The disclosure relates to a display apparatus including a display panel that may be disassembled and replaced without damage.

2. Description of Related Art

A display apparatus converts acquired or stored electrical information into visual information and displays the visual information to a user, and such a display apparatus is used in various fields, such as homes and businesses.

The display apparatus may be classified into a light emitting type display apparatus including a display panel that emits light by itself, such as an organic light emitting diode (OLED), and a light receiving type display apparatus including a display panel that cannot emit light by itself and needs to be supplied with light from a backlight unit, such as a liquid crystal display (LCD) panel.

In the case of a display apparatus including a display panel that emits light by itself, there is an advantage that the display apparatus is formed to be thin by not including a backlight unit. Due to such a thin structure, in the display apparatus including a self-emissive display panel, disassembling and replacing of the display panel may not be possible.

SUMMARY

According to an aspect of the disclosure, there is provided a display apparatus including a display panel that is allowed to be disassembled and replaced without damage.

According to an aspect of the disclosure, there is provided a display apparatus having an ultra-slim appearance by reducing the size of a rear cover, which is the thickest part of the display apparatus.

According to an aspect of the disclosure, there is provided a display apparatus allowing a display panel, of which a rear surface is coupled to a substrate, to be detachably coupled to a rear chassis.

According to an aspect of the disclosure, a display apparatus includes: a display panel; a rear chassis covering a rear surface of the display panel; a support frame coupled to the rear chassis; a panel holder provided on the rear surface of the display panel to face the support frame, the panel holder being configured to be coupled to the support frame to attach the display panel to the rear chassis; and a wire configured to: couple the panel holder to the support frame based on the wire being coupled to the panel holder and the support frame, and release the coupling between the panel holder and the support frame based on the wire being separated from the panel holder and the support frame.

The rear chassis may have a chassis hole formed therein and through which the wire passes, and the wire may be drawn out of the rear chassis through the chassis hole from a rear side of the rear chassis to be separated from the panel holder and the support frame.

The display apparatus may further include a rear cover coupled to the rear side of the rear chassis to cover a first portion of the rear chassis, and the chassis hole is provided in the portion of the rear chassis covered by the rear cover.

A first end of the rear cover and a first end of the rear chassis may be spaced apart from each other by a first distance, and a second end of the rear cover and a second end of the rear chassis may be spaced apart from each other by the first distance.

A remaining portion of the rear chassis, other than the first portion of the rear chassis, may form a rear external appearance of the display apparatus.

The display apparatus may further include a substrate configured to transmit a signal to drive the display panel and coupled to the rear surface of the display panel.

The display apparatus may further include a film cable configured to connect the display panel to the substrate, and the panel holder may be attached to the rear surface of the display panel by an adhesive member provided on a lateral side of the film cable.

While the wire is coupled to the panel holder and the support frame, a first portion of the wire may be supported by the panel holder, and a second portion of the wire spaced apart from the first portion may be supported by the support frame to couple the panel holder and the support frame with each other.

The panel holder and the support frame may be restrained by a tension of the wire to restrict the panel holder and the support frame from moving away from each other in a first direction, and the wire may be separated from the panel holder and the support frame by moving in a second direction intersecting the first direction.

While the wire is separated from the panel holder and the support frame, the panel holder may be moved a distance in a third direction intersecting the first direction and the second direction and then separated from the support frame in the first direction.

The panel holder may include: a first panel holder provided adjacent to a lower end and a first side end of the display panel; and a second panel holder provided adjacent to the lower end and a second side end of the display panel.

The support frame may include: a first support frame provided adjacent to a lower end and a first side end of the rear chassis to correspond to the first panel holder; and a second support frame provided adjacent to the lower end and a second side end of the rear chassis to correspond to the second panel holder.

The display panel may include: a light-emissive panel configured to emit light and display an image; and a heat dissipation sheet attached to a rear surface of the light-emissive panel and configured to dissipate heat.

The heat dissipation sheet may include at least one of graphite, aluminum or copper.

The heat dissipation sheet may be configured to be detachable from the rear chassis.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 1 is a front perspective view illustrating a display apparatus according to an embodiment;

FIG. 2 is a rear perspective view illustrating a display apparatus according to an embodiment;

FIG. 4 is a rear exploded perspective view illustrating a display apparatus according to an embodiment;

DETAILED DESCRIPTION

Figure 3:
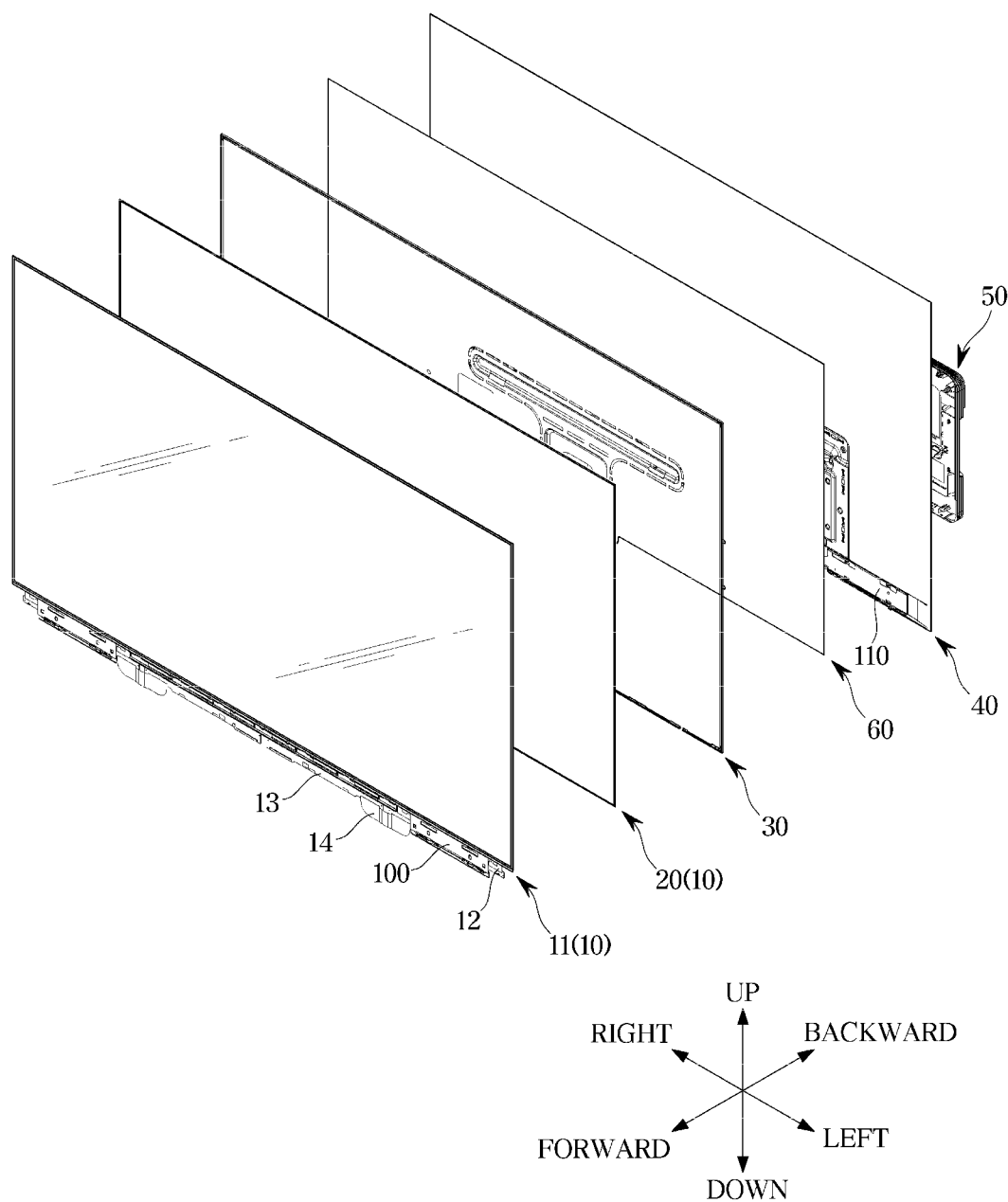
FIG. 3 is a front exploded perspective view illustrating a display apparatus according to an embodiment.

Embodiments described in the specification and configurations shown in the accompanying drawings are merely examples of the disclosure, and various modifications may replace the embodiments and the drawings of the disclosure at the time of filing of the application.

Further, identical symbols or numbers in the drawings of the disclosure denote components or elements configured to perform substantially identical functions.

Further, terms used herein are only for the purpose of describing particular embodiments and are not intended to limit to the disclosure. The singular form is intended to include the plural form as well, unless the context clearly indicates otherwise. It should be further understood that the terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Further, it should be understood that, although the terms "first," "second," etc. may be used herein to describe various elements, the elements are not limited by the terms, and the terms are only used to distinguish one element from another. For example, a first element could be termed a second element, and similarly, a second element could be termed a first element without departing from the scope of the disclosure. The term "and/or" includes combinations of one or all of a plurality of associated listed items.

The terms "front", "rear/back", "left", "right", and the like as herein used are defined with respect to the drawings, but the terms may not restrict the shape and position of the respective components.

Hereinafter, an embodiment according to the disclosure will be described in detail with reference to the accompanying drawings.

FIG. 1 is a front perspective view illustrating a display apparatus according to an embodiment.

Referring to FIG. 1, a display apparatus 1 is a device capable of processing an image signal received from the outside and visually displaying a processed image. The following description will be made in relation that the display apparatus 1 is a television (TV), but the disclosure is not limited thereto. For example, the display apparatus 1 may be implemented in various forms, such as a monitor, a portable multimedia device, a portable communication device, etc., as long as it can visually display an image.

In addition, the display apparatus 1 may be a large format display (LFD) installed outdoors, such as on the roof of a building or at a bus stop. Here, the outdoors is not limited to an open-air area as long as it is a place where the display apparatus 1 according to an embodiment may be installed and a large number of people may enter and exit, such as a subway station, a shopping mall, a movie theater, a company, or a store.

The display apparatus I may receive content including video signals and audio signals from various content sources, and output video and audio corresponding to the video signal and the audio signals. For example, the display apparatus 1 may receive content data through a broadcast reception antenna or a wired cable, receive content data from a content reproduction device, or receive content data from a content providing server of a content provider.

FIG. 2 is a rear perspective view illustrating a display apparatus according to an embodiment.

Referring to FIG. 2, the rear external appearance of the display apparatus 1 may be formed by a rear chassis 40 and a rear cover 50.

The rear cover 50 may be coupled to a rear side of the rear chassis 40. The rear cover 50 may be coupled to a lower central portion of the rear chassis 40, at the rear side of the rear chassis 40. The rear cover 50 may be provided to cover a portion of the rear chassis 40. The remaining portion of the rear chassis 40 not covered by the rear cover 50 may provide a thickness thinner than that of the portion. According to an embodiment, the thickest part of the display apparatus I may be a part in which the rear cover 50 is provided. In proportion to the increasing area of the rear cover 50, the thick part of the display apparatus 1 is subject to increase. Accordingly, as the area of the rear cover 50 is smaller, the user may feel that the overall thickness of the display apparatus 1 is thinner. According to the aspect of the disclosure, an ultra-slim appearance of the display apparatus 1 may be realized by minimizing the area of the rear cover 50.

More specifically, one end of the rear cover 50 and one end of the rear chassis 40 may be spaced apart from each other by a predetermined distance. Similarly, the other end of the rear cover 50 and the other end of the rear chassis 40 may be spaced apart from each other by the predetermined distance. In other words, the left end of the rear cover 50 and the left end of the rear chassis 40 may be spaced apart from each other by a first distance, and the right end of the rear cover 50 and the right end of the rear chassis 40 may be spaced apart from each other by the first distance. With the above structure, the peripheral portions of opposite side surfaces of the display apparatus 1 and the peripheral portion of the upper surface of the display apparatus I may become very thin. However, the disclosure is not limited thereto, and as such, according to another example embodiment, the left end of the rear cover 50 and the left end of the rear chassis 40 may be spaced apart from each other by a first distance, and the right end of the rear cover 50 and the right end of the rear chassis 40 may be spaced apart from each other by a second distance different from the first distance.

FIG. 3 is a front exploded perspective view illustrating a display apparatus according to an embodiment. FIG. 4 is a rear exploded perspective view illustrating a display apparatus according to an embodiment.

Referring to FIGS. 3 and 4, the display apparatus 1 according to an embodiment may include a display panel 10, a front chassis 30 extending along the circumference of the display panel 10 and provided to cover the side surface of the display panel 10, a rear chassis 40 provided to cover the rear surface of the display panel 10, and a rear cover 50 provided to cover a portion of the rear surface of the rear chassis 40. In addition, the display apparatus 1 may further include an inner plate 60 coupled to the front of the rear chassis 40 and provided to reinforce the strength of the rear chassis 40 and dissipate heat generated from the display panel 10.

According to an embodiment, the display panel 10 may include a light-emissive panel 11 configured to emit light by itself to display an image and a heat dissipation sheet 20 attached to a rear surface of the light-emissive panel 11 and provided to emit heat. The heat dissipation sheet 20 may be provided in a size corresponding to that of the light-emissive panel 11, and may be attached to the rear surface of the light-emissive panel 11 by an adhesive member, such as an adhesive or double-sided tape.

The light-emissive panel 11 may be configured to display an image using an organic light emitting device (OLED). The light-emissive panel 11, which does not include a backlight unit at the rear side thereof, may have a smaller thickness than a light-receiving panel.

According to an embodiment, a film cable 12 may be provided at a lower end of the light-emissive panel 11. The film cable 12 may be coupled to the light-emissive panel 11 in the form of a Chip On Film (COF). The film cable 12 may be formed of a flexible material to enable bending. One end of the film cable 12 may be connected to the lower end of the light-emissive panel 11, and the other end of the film cable 12 may be bent to be provided adjacent to the rear surface of the heat dissipation sheet 20.

A substrate 13 may be provided at the other end of the film cable 12. The substrate 13 may be configured to send a signal to drive the light-emissive panel 11. The substrate 13 may be coupled to the rear surface of the heat dissipation sheet 20. The substrate 13 may be attached to the rear surface of the heat dissipation sheet 20 by an adhesive member, such as an adhesive or double-sided tape.

The number of the substrates 13 may vary according to the size of the light-emissive panel 11. As the size of the light-emissive panel 11 increases, the number of the substrates 13 may increase. The display apparatus 1 may include a connecting cable 13 provided to connect two substrates 13 adjacent to each other. According to an embodiment, the display apparatus 1 may include four substrates 13, a connecting cable 13 connecting two of the four substrates 13, and a connecting cable 13 connecting the remaining two substrates 13.

According to an embodiment, the heat dissipation sheet 20 may be attached to the rear surface of the light-emissive panel 11 to dissipate heat. The heat dissipation sheet 20 may increase a contact area with the light-emissive panel 11 to effectively absorb heat from the light-emissive panel 11. To this end, the heat dissipation sheet 20 and the light-emissive panel 11 may be coupled to each other by an adhesive member.

The heat dissipation sheet 20 may include at least one of graphite, aluminum, or copper. Preferably, the heat dissipation sheet 20 may include graphite.

According to an embodiment, the heat dissipation sheet 20 may be provided to be detachable from the rear chassis 40. In other words, the heat dissipation sheet 20 may not be coupled to the rear chassis 40. Accordingly, the heat dissipation sheet 20 may be separated from the rear chassis 40 without any limitation.

The front chassis 30 may be provided to cover the side surface of the display panel 10. The front chassis 30 may be formed to extend along the circumference of the display panel 10. Accordingly, the front chassis 30 may be provided in a substantially square ring shape.

The rear chassis 40 may be provided to have a size corresponding to that of the display panel 10. The rear chassis 40 may be provided to cover the rear surface of the display panel 10. As described above, the rear chassis 40 may form a rear external appearance of the display apparatus 1 together with the rear cover 50.

The inner plate 60 may have a size corresponding to that of the rear chassis 40 and may be coupled to the front surface of the rear chassis 40. The inner plate 60 may be provided to be coupled to the rear chassis 40 to reinforce rigidity of the rear chassis 40 and dissipate heat generated from the display panel 10.

The rear cover 50 may be provided to cover a portion of the rear surface of the rear chassis 40. The rear cover 50 may be coupled to the rear surface of the rear chassis 40 to form an inner space. In the inner space formed between the rear cover 50 and the rear chassis 40, a T-con board (a timing controller), a main board, a power supply, etc. may be provided.

Figure 5:
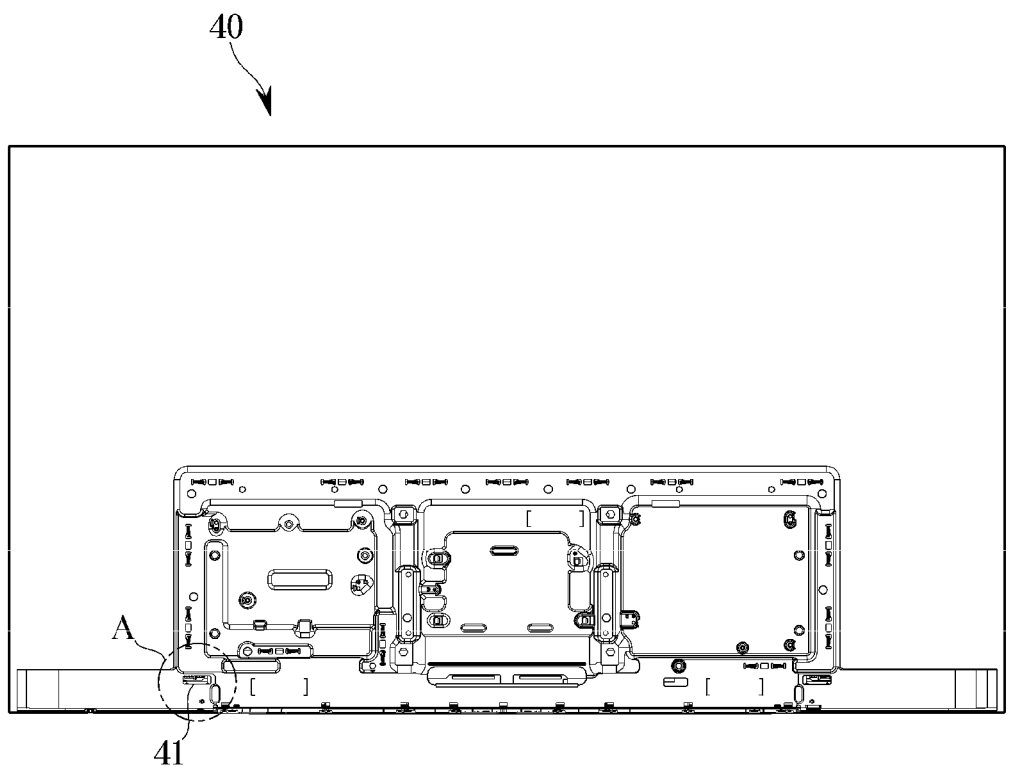
FIG. 5 is a rear view illustrating a display apparatus according to an embodiment, with a rear cover removed.

FIG. 5 is a rear view illustrating a display apparatus according to an embodiment with a rear cover removed.

Figure 6:
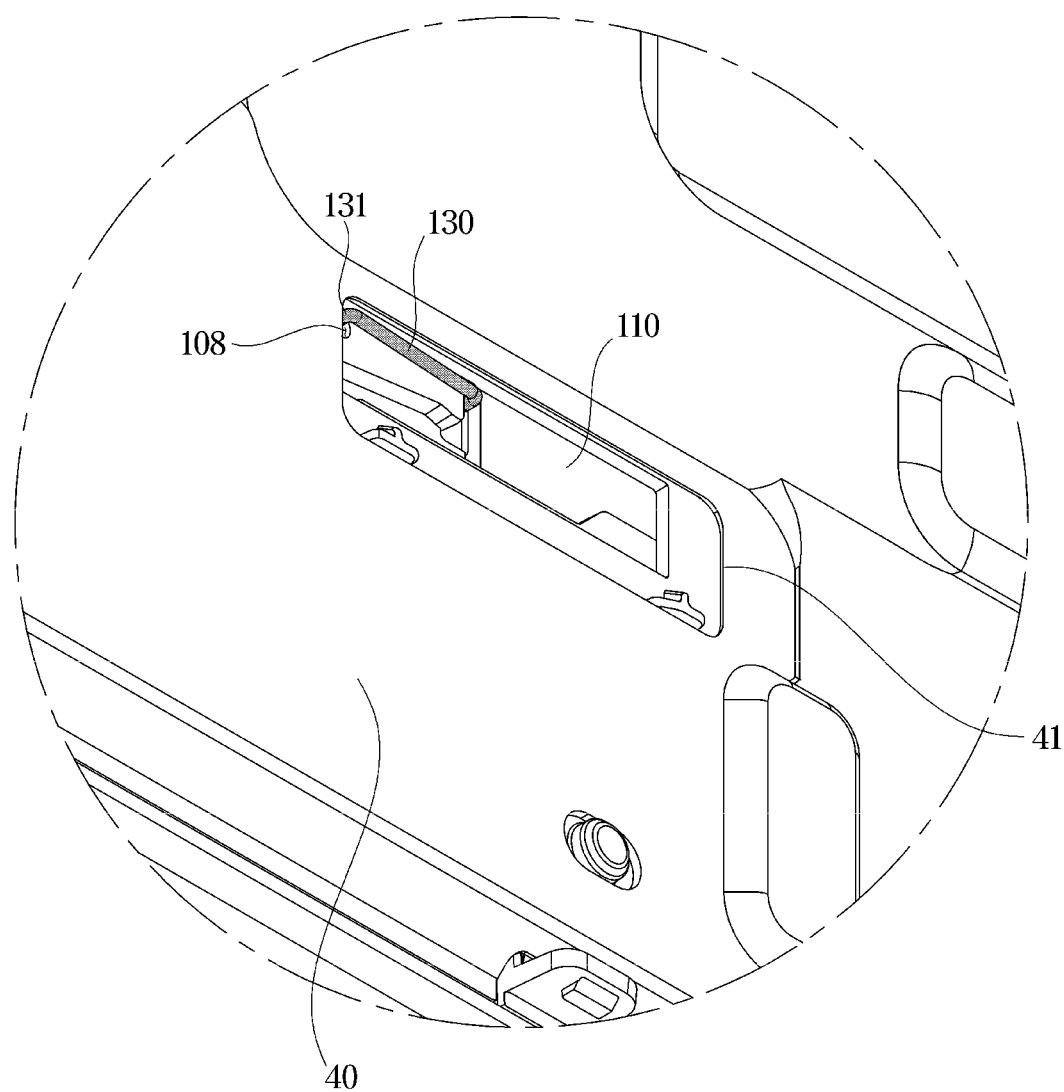
FIG. 6 is an enlarged view of portion A of FIG. 5, seen from a different angle.
Figure 7:
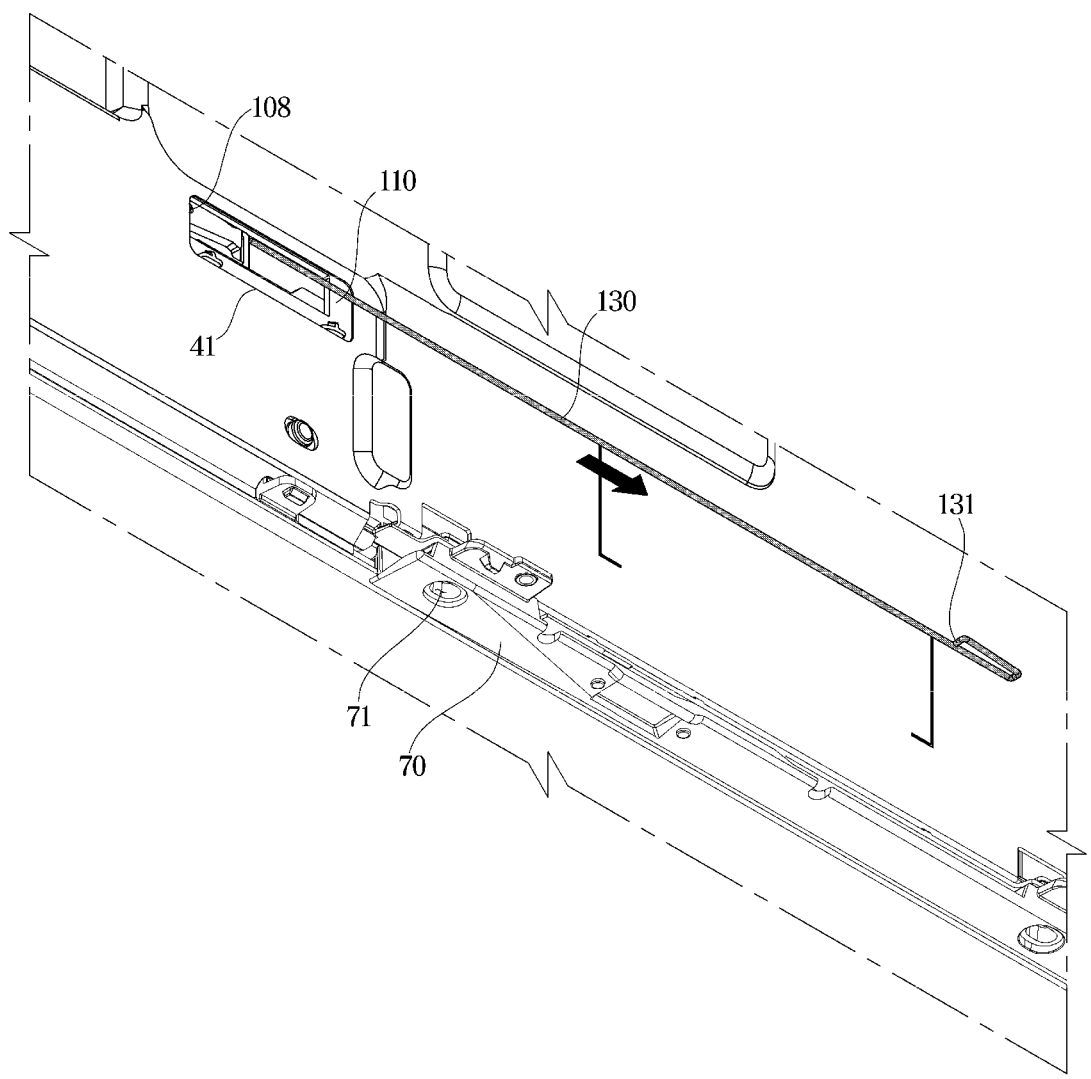
FIG. 7 is a view illustrating a state of FIG. 6, with a wire separated.

FIG. 6 is an enlarged view of portion A of FIG. 5, seen from a different angle. FIG. 7 is a view illustrating a state of FIG. 6, with a wire separated.

Referring to FIGS. 5, 6 and 7, in the display apparatus 1 according to an embodiment, a user may easily withdraw a wire 130 without a separate member. The wire 130 is a component that couples a panel holder 100 to a support frame 110 to be described below, and as the wire 130 is drawn out, the coupling between the panel holder 100 and the support frame 110 may be released.

More specifically, when the rear cover 50 is removed from the display apparatus 1, a chassis hole 41 may be exposed to the outside. The rear chassis 40 may include the chassis hole 41 through which the wire 130 passes. The chassis hole 41 may be covered by the rear cover 50. The chassis hole 41 may be provided in an area of the rear chassis 40 covered by the rear cover 50. The wire 130 may be provided to be accessible from the rear side of the rear chassis 40. At least a portion of the wire 130 may be exposed to the outside through the chassis hole 41 of the rear chassis 40. The user may separate the wire 130 from the display apparatus 1 to release the coupling between the display panel 10 and the rear chassis 40. The wire 130 may be drawn out to the rear of the rear chassis 40 through the chassis hole 41.

Referring to FIGS. 6 and 7, the wire 130 may be moved to a lateral side to be drawn out of the display apparatus 1. The wire 130 may be drawn out of the rear chassis 40 by passing through the chassis hole 41.

A bent end 131 of the wire 130 may be inserted into a wire hole 108 of the panel holder 100. After the bent end 131 of the wire 130 is drawn out from the wire hole 108, the wire 130 may be pulled to a lateral side to be drawn out of the display apparatus 1. As the wire 130 is drawn out of the display apparatus 1, the coupling between the panel holder 100 and the support frame 110 may be released.

The panel holder 100 and the support frame 110 coupled by the wire 130 may be provided on each side of the rear surface of the display panel 10. A bottom frame 70 may be provided between a pair of panel holders 100 and a pair of support frames 110. The bottom frame 70 may be provided at a central lower portion of the rear chassis 40. The bottom frame 70 may be provided with a fastening hole 71 which a fastening member, such as a screw, passes through. Since the fastening hole 71 of the bottom frame 70 is covered by the rear cover 50, the lower end of the display panel 10 may be coupled to the lower end of the rear chassis 40 using a fastening member, such as a screw, as in the related art.

On the other hand, in the case of both side ends of the rear chassis 40 that are not covered by the rear cover 50, the rear chassis 40 forms the rear external appearance of the display apparatus 1. For a neat appearance, a fastening hole or the like may not be provided in the rear chassis 40 exposed to the outside.

According to the aspect of the disclosure, it is possible to provide a structure in which both side ends of the rear chassis 40 are detachably coupled to both side ends of the display panel 10 corresponding thereto without including a fastening hole. More specifically, as the panel holder 100 coupled to the rear surface of the display panel 10 and the support frame 110 coupled to the front surface of the rear chassis 40 are coupled to and released from each other, the display panel 10 may be coupled to or detached from the rear chassis 40.

Figure 8:
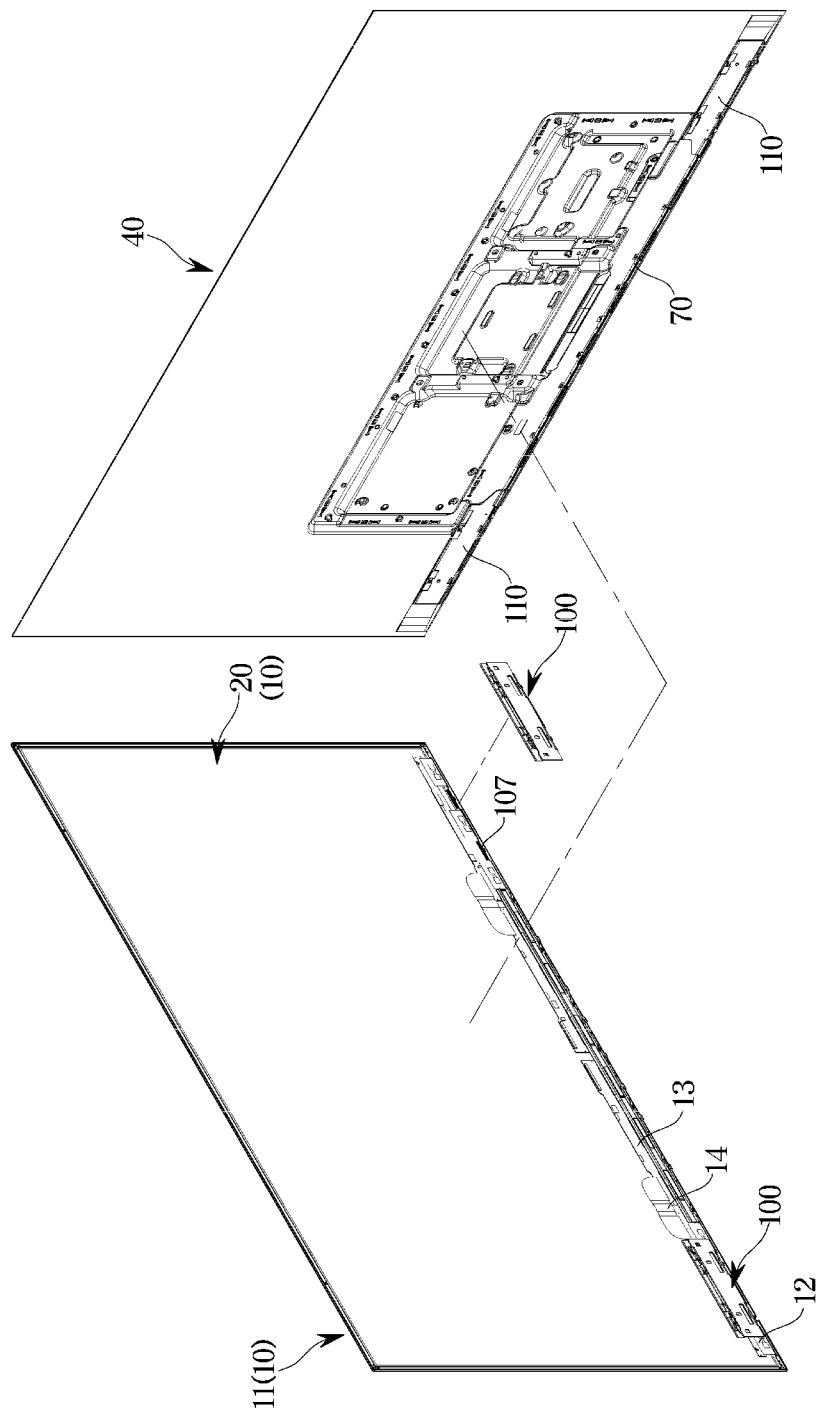
FIG. 8 is a view illustrating a display panel and a rear chassis separated from a display apparatus according to an embodiment.
Figure 9:
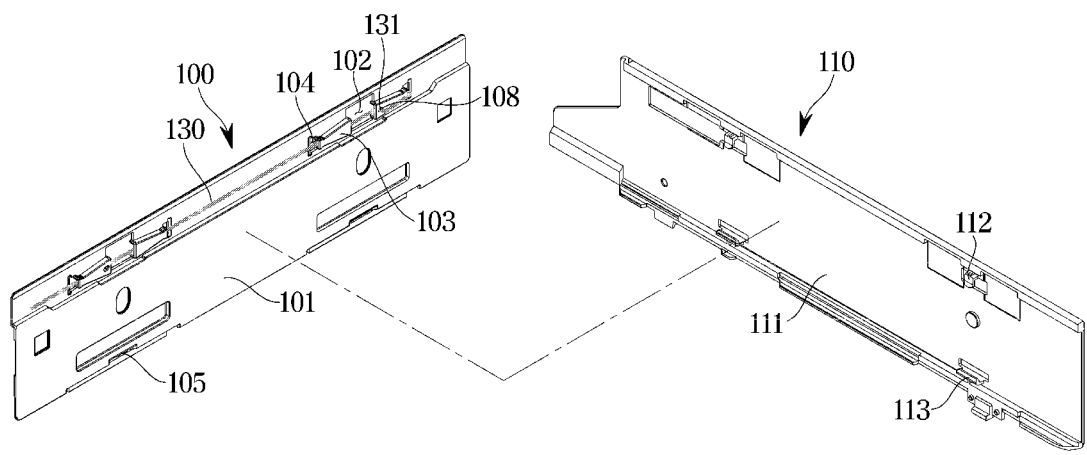
FIG. 9 is a view separately illustrating a panel holder and a support frame of a display apparatus according to an embodiment.
Figure 10:
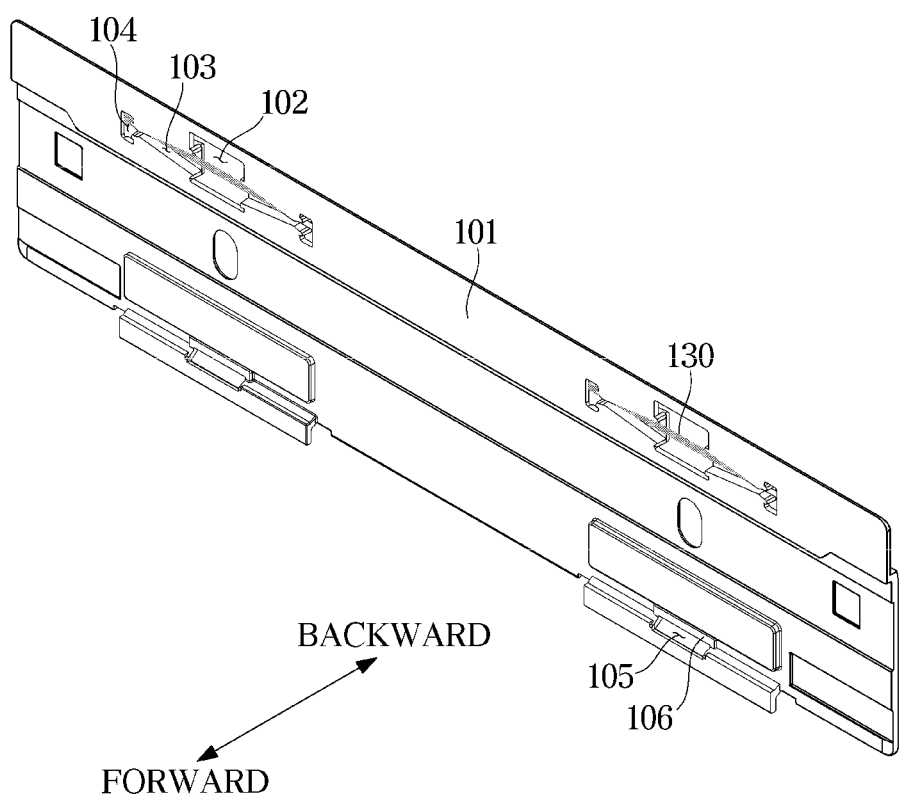
FIG. 10 is a view illustrating a panel holder and a wire coupled to the panel holder in a display apparatus according to an embodiment.
Figure 11:
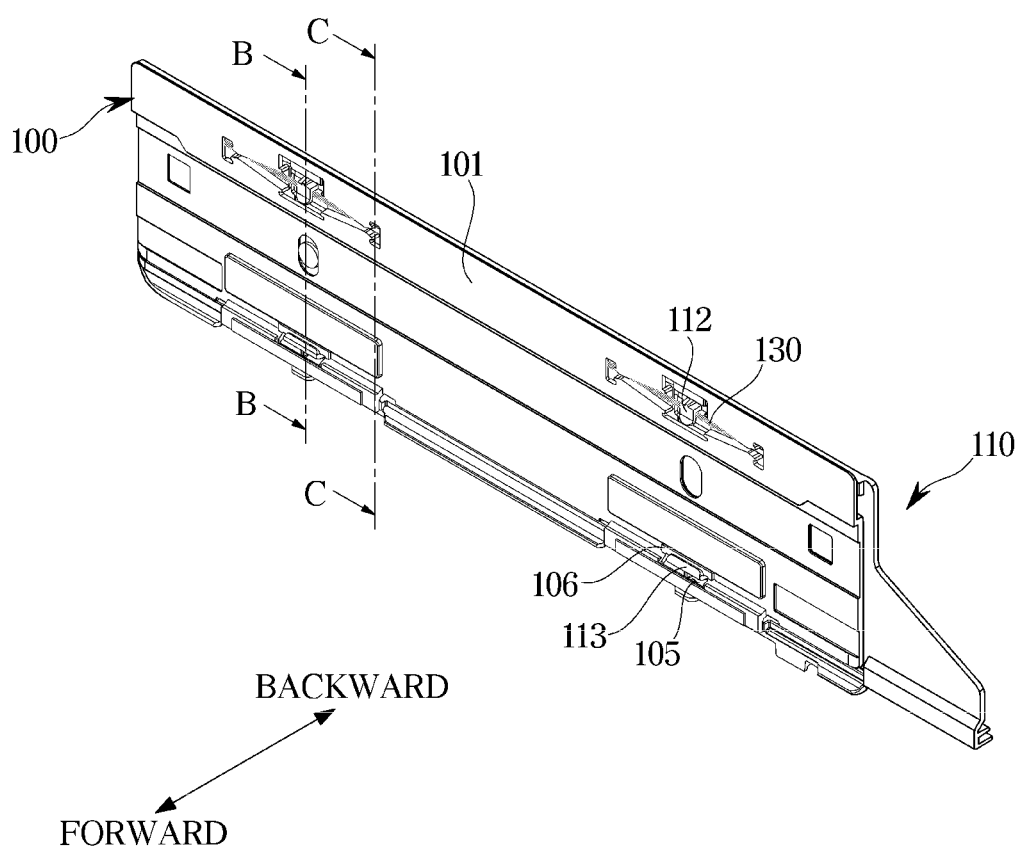
FIG. 11 is a view illustrating a panel holder and a support frame coupled by a wire in a display apparatus according to an embodiment.
Figure 12:
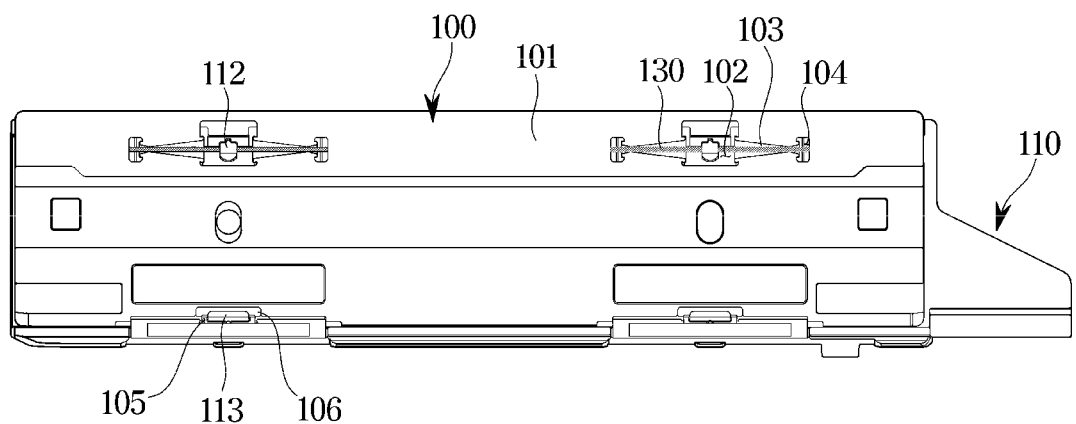
FIG. 12 is a front view illustrating a panel holder and a support frame coupled by a wire.

FIG. 8 is a view illustrating a display panel and a rear chassis separated from a display apparatus according to an embodiment. FIG. 9 is a view separately illustrating a panel holder and a support frame of a display apparatus according to an embodiment. FIG. 10 is a view illustrating a panel holder and a wire coupled to the panel holder in a display apparatus according to an embodiment. FIG. 11 is a view illustrating a panel holder and a support frame coupled by a wire in a display apparatus according to an embodiment. FIG. 12 is a front view illustrating a panel holder and a support frame coupled by a wire Referring to FIG. 8, the panel holder 100 may be coupled to the rear surface of the display panel 10. More specifically, the panel holder 100 may be attached to the rear surface of the display panel 10 by an adhesive member 107 provided between film cables 12 adjacent to each other. The adhesive member 107 may be provided on the lateral side of the film cable 12. The adhesive member 107 may include an adhesive and a double-sided tape. The type of the adhesive member 107 is not limited and may be any configuration capable of attaching the panel holder 100 to the rear surface of the display panel 10.

The panel holder 100 may be provided adjacent to the lower end of the display panel 10. In addition, the panel holders 100 may be provided as a pair and provided on one side and the other side of the display panel 10, respectively.

The support frame 110 may be coupled to the front surface of the rear chassis 40 to correspond to the panel holder 100. The support frame 110 may be provided adjacent to the lower end of the rear chassis 40. In addition, the support frame 110 may be provided as a pair and provided on one side and the other side of the rear chassis 40, respectively.

Referring to FIGS. 9 and 10, the wire 130 may be coupled to the panel holder 100. The wire 130 may be coupled to the panel holder 100 by traversing the panel holder 100 sideways. The wire 130 may pass through a second hole 104 of the panel holder 100 to be accommodated in a wire accommodating groove 103 so that the wire 130 is coupled to the panel holder 100. The bent end 131 of the wire 130 may be inserted into the wire hole 108 of the panel holder 100 so that the position of the wire 130 is fixed. By the bent end 131 of the wire 130 being inserted into the wire hole 108, the wire 130 may maintain a state of being coupled to the panel holder 100.

According to an example embodiment, the panel holder 100 includes a plate-shaped holder body 101, and a first hole 102, a second hole 104, and a third hole 105 formed to pass through the holder body 101. In addition, the panel holder 100 may include the wire accommodating groove 103 provided to accommodate the wire 130 and a protrusion support 106 provided to come in contact with a second protrusion 113 of the support frame 110. In addition, the panel holder 100 may include the wire hole 108 in to which the bent end of the wire 130 is inserted.

Referring to FIGS. 9 and 10, the support frame 110 may include a plate-shaped frame body 111, a first protrusion 112 protruding from the frame body 111 toward the panel holder 100, and a second protrusion 113 spaced downward from the first protrusion 112.

The first protrusion 112 may be provided to be inserted into the first hole 102 of the panel holder 100, and come in contact with a first portion of the wire 130 to support the first portion. The second protrusion 113 may be provided to be inserted into the third hole 105 of the panel holder 100 to engage with the protrusion support 106 of the panel holder 100. As the second protrusion 113 and the protrusion support 106 are engaged with each other, the panel holder 100 may not be separated from the support frame 110 in the forward direction.

Referring to FIGS. 11 and 12, the panel holder 100 and the support frame 110 may be coupled to each other by the wire 130. In a state in which the second protrusion 113 and the protrusion support 106 are engaged with each other as described above, the panel holder 100 may be restricted from moving forward of the support frame 110. However, when the panel holder 100 is moved upward with respect to the support frame 110 a predetermined distance, the panel holder 100 may be separable from the support frame 110 in the forward direction. To prevent this, the wire 130 may be coupled to the panel holder 100 and the support frame 110. In other words, the wire 130 may be positioned between the panel holder 100 and the support frame 110.

When the wire 130 is coupled to the panel holder 100 and the support frame 110, upward movement of the panel holder 100 with respect to the support frame 110 may be restricted. In addition, as the first portion of the wire 130 is supported by the panel holder 100, and a second portion different from the first portion of the wire 130 is supported by the support frame 110, the panel holder 100 and the support frame 110 may be fixed without being moved in the front-rear direction.

More specifically, the first portion of the wire 130 may be supported by the first protrusion 112 of the support frame 110, and the second portion of the wire 130 may be accommodated in the wire accommodating groove 103. The second portion of the wire 130 may be supported by one surface of the panel holder 100 forming the wire accommodating groove 103. The second portion of the wire 130 may indicate a pair of points provided on both sides of the first portion of the wire 130. The first protrusion 112 supporting the first portion of the wire 130 may be spaced apart from the wire accommodating groove 103 supporting the second portion of the wire 130 in the front-rear direction. Since the first portion of the wire 130 supported by the first protrusion 112 is spaced apart from the second portion of the wire 130 supported by the wire accommodating groove 103 in the front-rear direction, the wire 130 may be bent. By the wire 130 being bent, the panel holder 100 may be coupled to the support frame 110 by the tension of the wire 130 without a gap in the front-rear direction.

Figure 13:
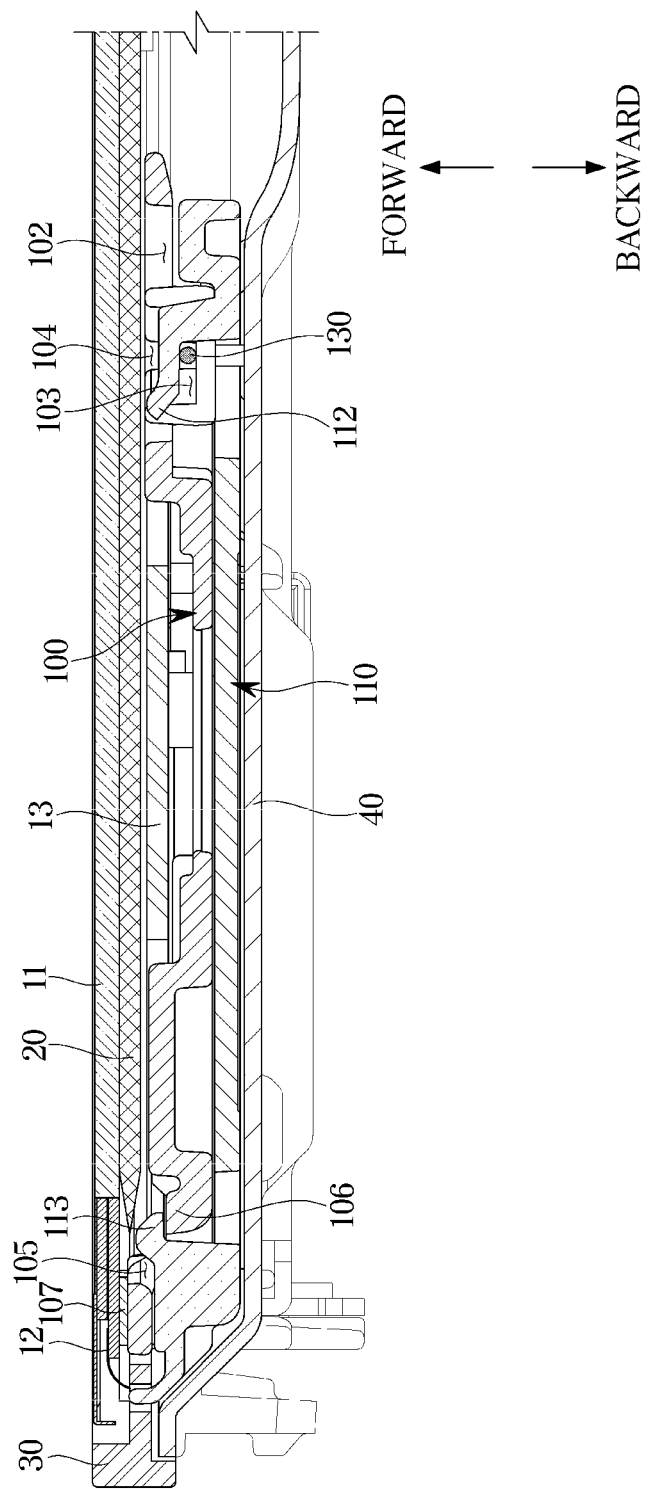
FIG. 13 is a cross-sectional view taken along line B-B of FIG. 11, which shows a display panel and a rear chassis.

FIG. 13 is a cross-sectional view taken along line B-B of FIG. 11, which shows a display panel and a rear chassis.

Referring to FIG. 13, the panel holder 100 may be coupled to the support frame 110 without a gap in the front-rear direction as described above. Since the panel holder 100 is coupled to the display panel 10 and the support frame 110 is coupled to the rear chassis 40, the coupling of the panel holder 100 to the support frame 110 allows the display panel 10 to be coupled to the rear chassis 40.

Figure 14:
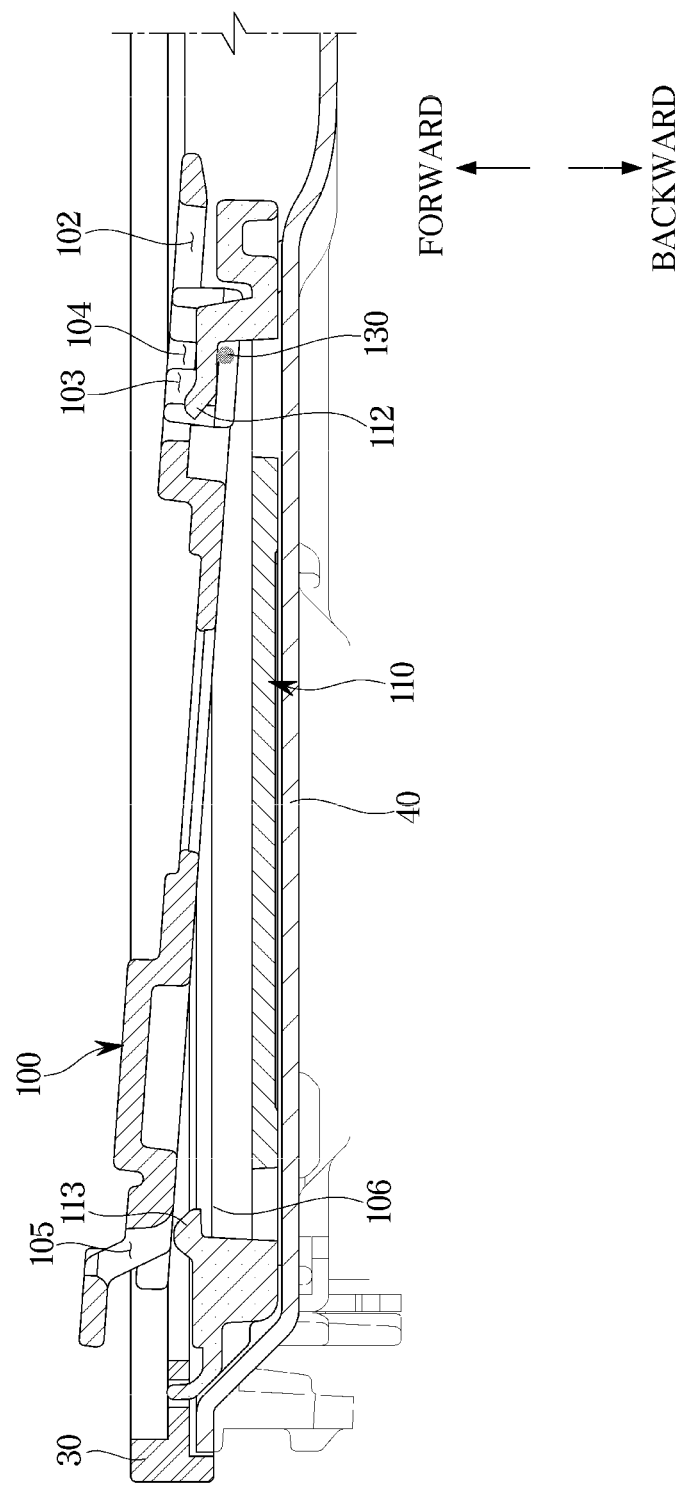
FIG. 14 is a view illustrating a state before a panel holder and a wire coupled to the panel holder are coupled to a support frame.
Figure 15:
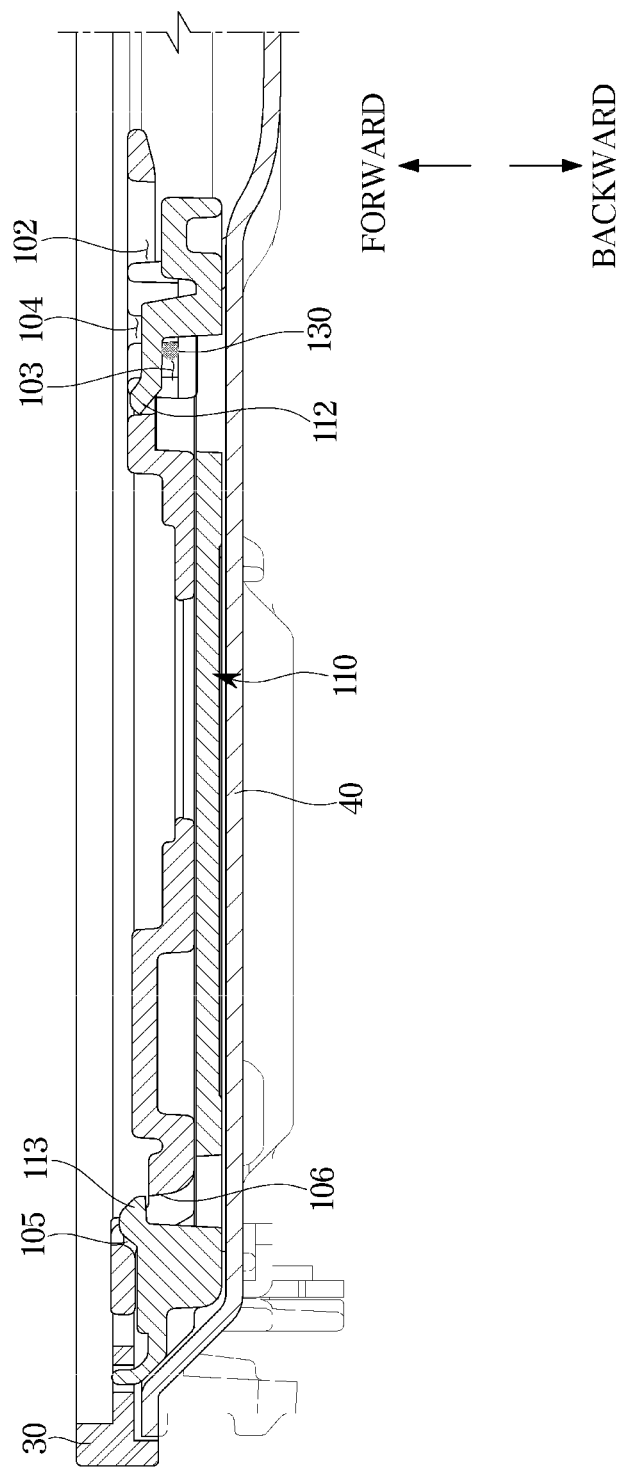
FIG. 15 is a view illustrating a process in which a panel holder and a wire coupled to the panel holder are coupled to a support frame.
Figure 16:
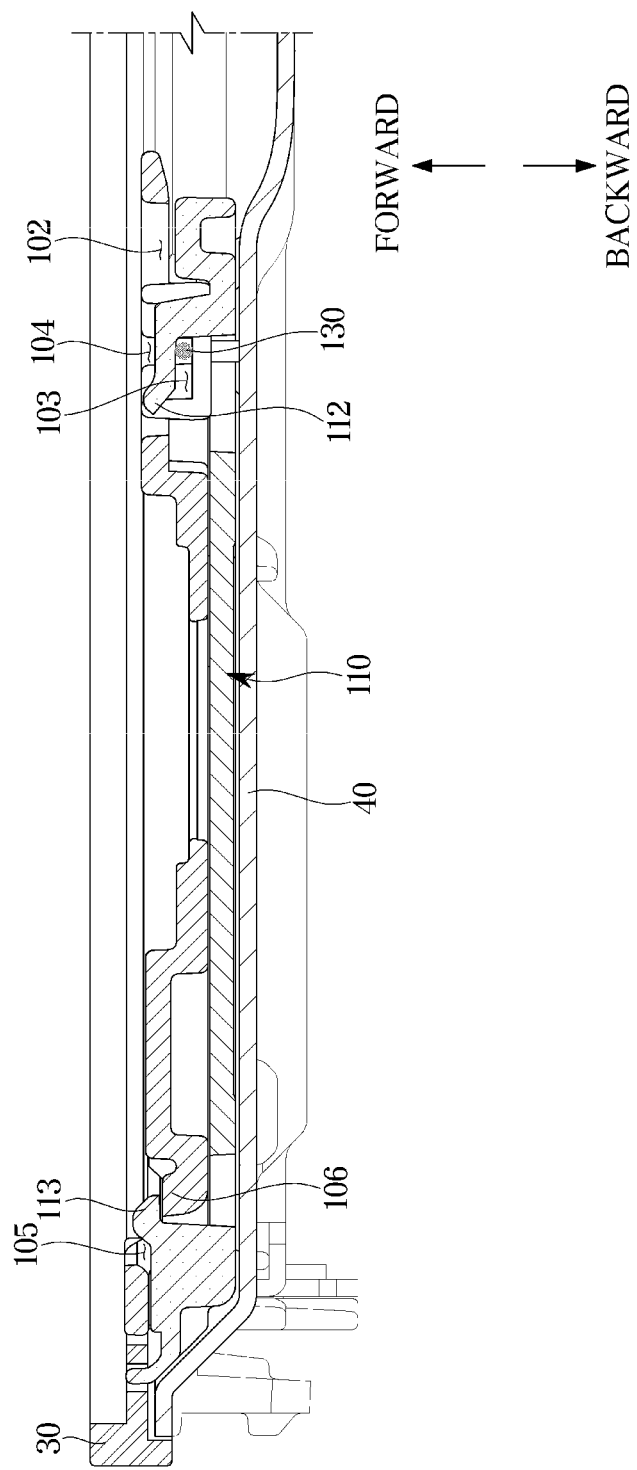
FIG. 16 is a view illustrating a state after a panel holder and a wire coupled to the panel holder are coupled to a support frame.

FIG. 14 is a view illustrating a state before a panel holder and a wire coupled to the panel holder are coupled to a support frame. FIG. 15 is a view illustrating a process in which a panel holder and a wire coupled to the panel holder are coupled to a support frame. FIG. 16 is a view illustrating a state after a panel holder and a wire coupled to the panel holder are coupled to a support frame.

A process in which the panel holder 100 is coupled to the support frame 110 will be described with reference to FIGS. 14 to 16.

Referring to FIGS. 14 to 16, when the panel holder 100 is coupled to the support frame 110, the display panel 10 may not be coupled to the panel holder 100. According to an embodiment, after the panel holder 100 is coupled to the support frame 110, the display panel 10 may be coupled to the panel holder 100.

When the panel holder 100 is coupled to the support frame 110, the wire 130 may be coupled to the panel holder 100 first. With the wire 130 coupled to the panel holder 100, the panel holder 100 may be coupled to the support frame 110.

Referring to FIG. 14, the panel holder 100 may be moved for the first portion of the wire 130 to be positioned below the first protrusion 112. By obliquely moving the panel holder 100 with respect to the support frame 110, the first portion of the wire 130 may be positioned below the first protrusion 112.

Referring to FIG. 15, after moving the panel holder 100 so that the first portion of the wire 130 is positioned below the first protrusion 112, the panel holder 100 may be rotated by a predetermined angle using the wire 130 as a rotation axis. In this case, by moving the panel holder 100 upwards of the support frame 110, the protrusion support 106 may be positioned below the second protrusion 113. In this case, the wire 130 is bent, and tension of the wire 130 may be applied to move the panel holder 100 downward with respect to the support frame 110.

Referring to FIG. 16, the panel holder 100 may be moved downward with respect to the support frame 110 by the tension of the wire 130. As the panel holder 100 moves downward with respect to the support frame 110, the second protrusion 113 and the protrusion support 106 may be engaged with each other. When the second protrusion 113 and the protrusion support 106 are engaged with each other, the panel holder 100 may not be separated from the support frame 110. In addition, the panel holder 100 may not be moved upwards of the support frame 110 due to the tension of the wire 130. Accordingly, the panel holder 100 and the support frame 110 may be maintained in a coupled state.

Figure 17:
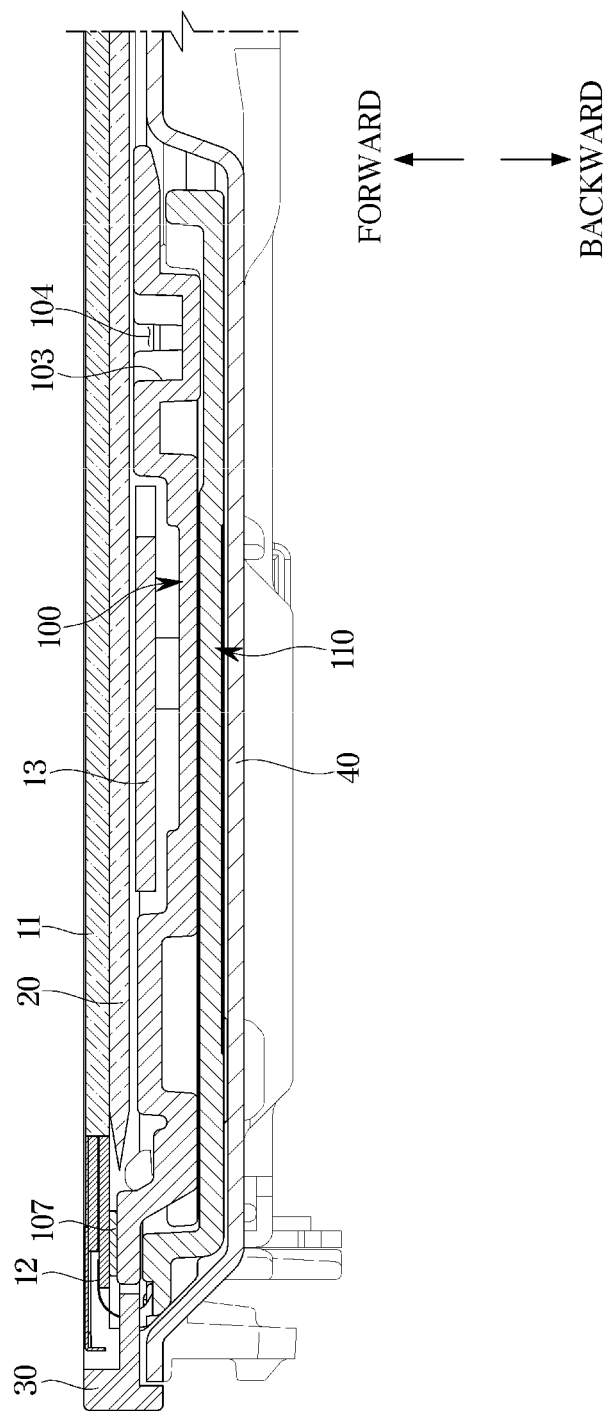
FIG. 17 is a cross-sectional view taken along line C-C of FIG. 11 with a wire removed, which shows a display panel and a rear chassis.
Figure 18:
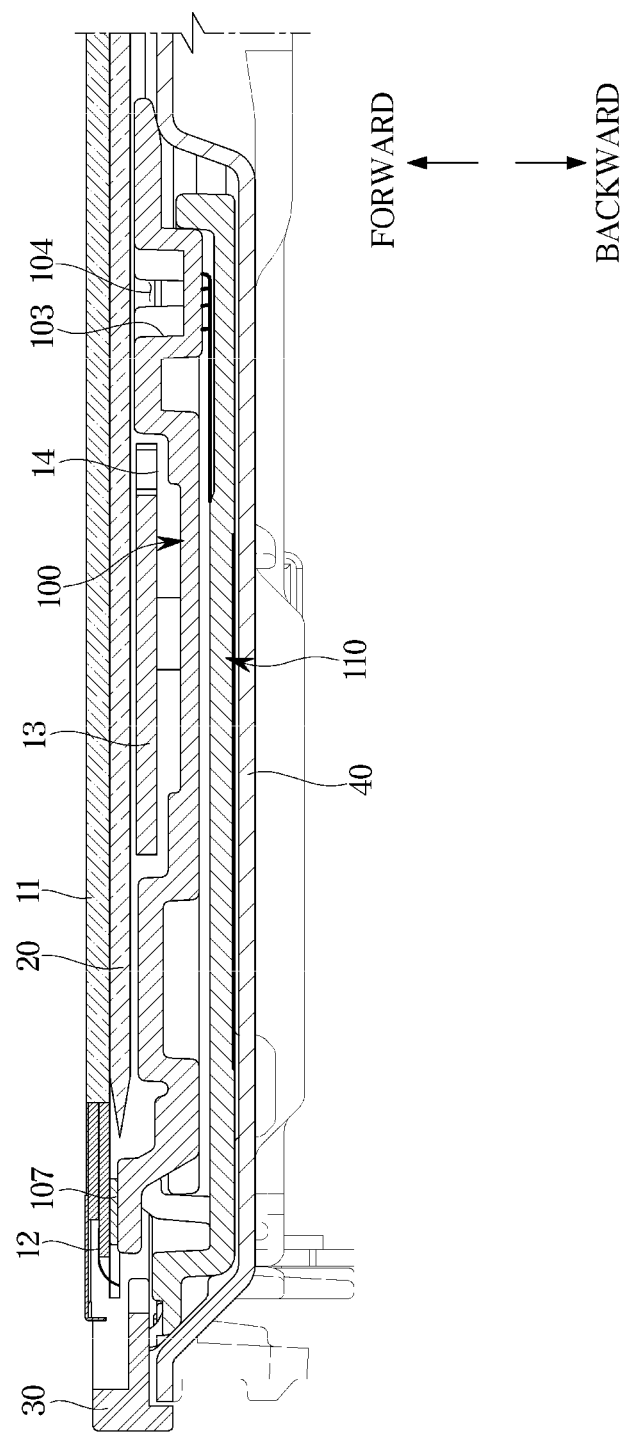
FIG. 18 is a view illustrating a state of FIG. 17 with a panel holder moved upward with respect to a support frame.
Figure 19:
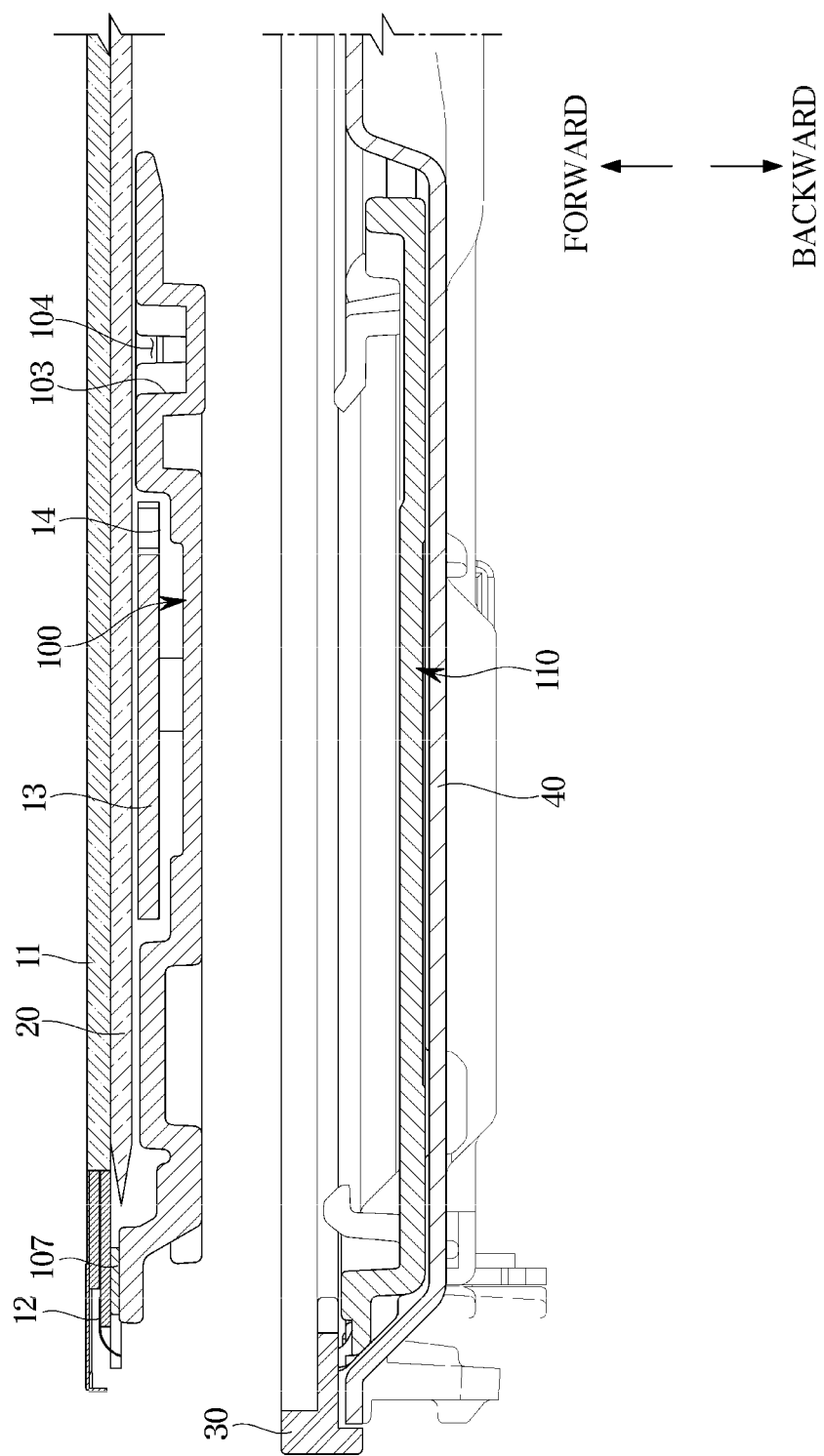
FIG. 19 is a view illustrating a state after a panel holder is separated from a support frame to the front.

FIG. 17 is a cross-sectional view taken along line C-C of FIG. 11 with a wire removed, which shows a display panel and a rear chassis. FIG. 18 is a view illustrating a state of FIG. 17 with a panel holder moved upward with respect to a support frame. FIG. 19 is a view illustrating a state after a panel holder is separated from a support frame to the front.

Referring to FIGS. 17 to 19, after the rear cover 50 is disassembled from the rear chassis 40, the panel holder 100 may be separated from the support frame 110 without a separate member. In addition, the display panel 10 may be separated from the rear chassis 40.

As described above, the wire 130 may be drawn out of the display apparatus 1 through the chassis hole 41 from the rear side of the rear chassis 40.

Referring to FIGS. 17 and 18, in a state in which the wire 130 is drawn out, upward movement of the panel holder 100 with respect to the support frame 110 is not restricted. Accordingly, when the display panel 10 is moved upward, the panel holder 100 together with the display panel 10 may be moved upward with respect to the support frame 110. When the panel holder 100 moves upward with respect to the support frame 110, the engagement between the second protrusion 113 and the protrusion support 106 may be released. In other words, the forward movement of the protrusion support 106 is not restricted by the second protrusion 113. Accordingly, as shown in FIG. 19, the display panel 10 and the panel holder 100 may be separated from the support frame 110.

According to an embodiment, the display panel 10 and the substrate 13 attached to the display panel 10 may be separated from the rear chassis 40 without damage to the display panel 10.

According to an example embodiment, adhesive members may be provided on the upper surface and both side surfaces of the display panel 10 to couple the upper surface and both side surfaces of the display panel 10 to the rear chassis 40.

The type of the adhesive member is not limited, but may be, for example, a double-sided tape.

When the adhesive members provided on the upper surface and both side surfaces of the display panel 10 are separated, and then the panel holder 100 provided on the lower surface of the display panel 10 is separated from the support frame 110, the display panel 10 may be separated from the rear chassis 40 without damaging the display panel 10. When the couplings on the four sides of the display panel 10 are removed, since the rear surface of the heat dissipation sheet 20 and the front surface of the rear chassis 40 are separable from each other as described above, the display panel 1 may be separable from the rear chassis 40 in the forward direction. Accordingly, it is possible to disassemble and replace the display panel 10 including the light-emissive panel 11.

Figure 20:
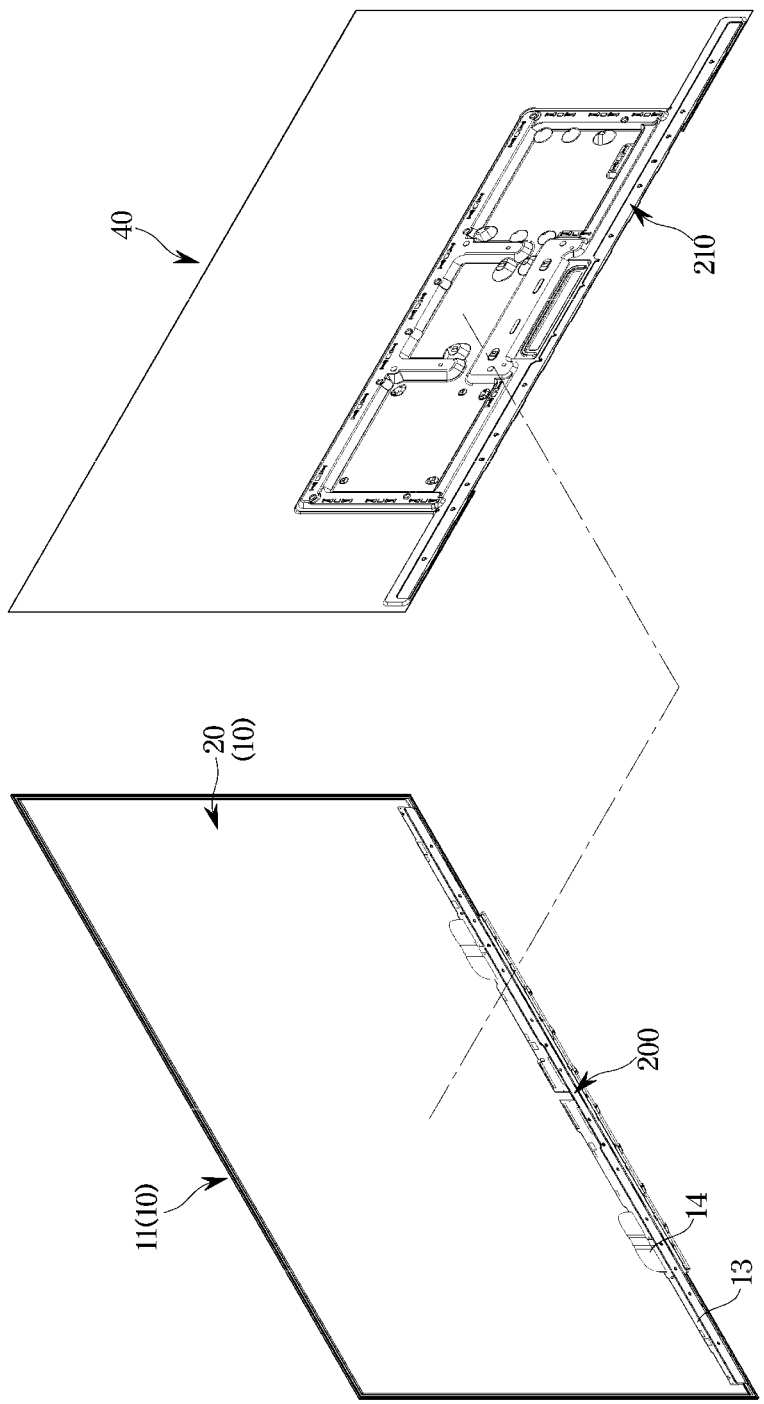
FIG. 20 is a view illustrating a display panel and a rear chassis separated from a display apparatus according to an embodiment.
Figure 21:
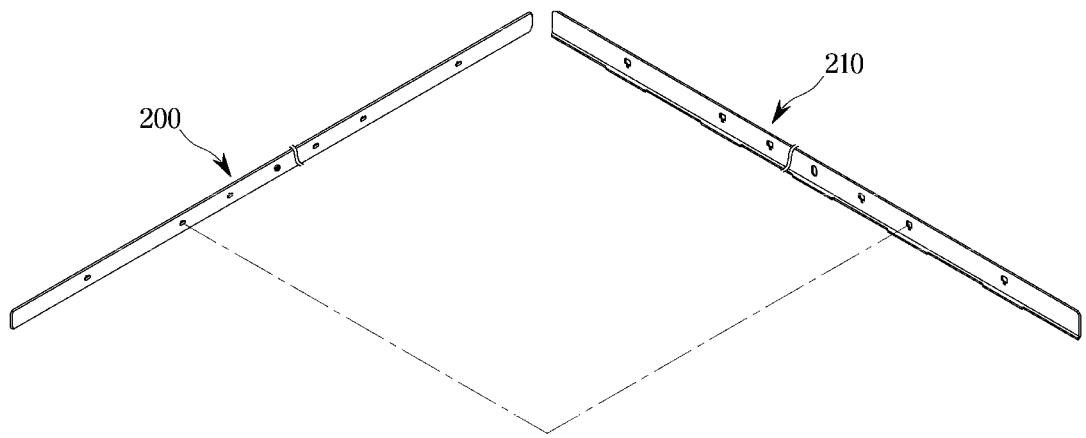
FIG. 21 is a view separately illustrating a panel holder and a support frame in a display apparatus according to an embodiment.
Figure 22:
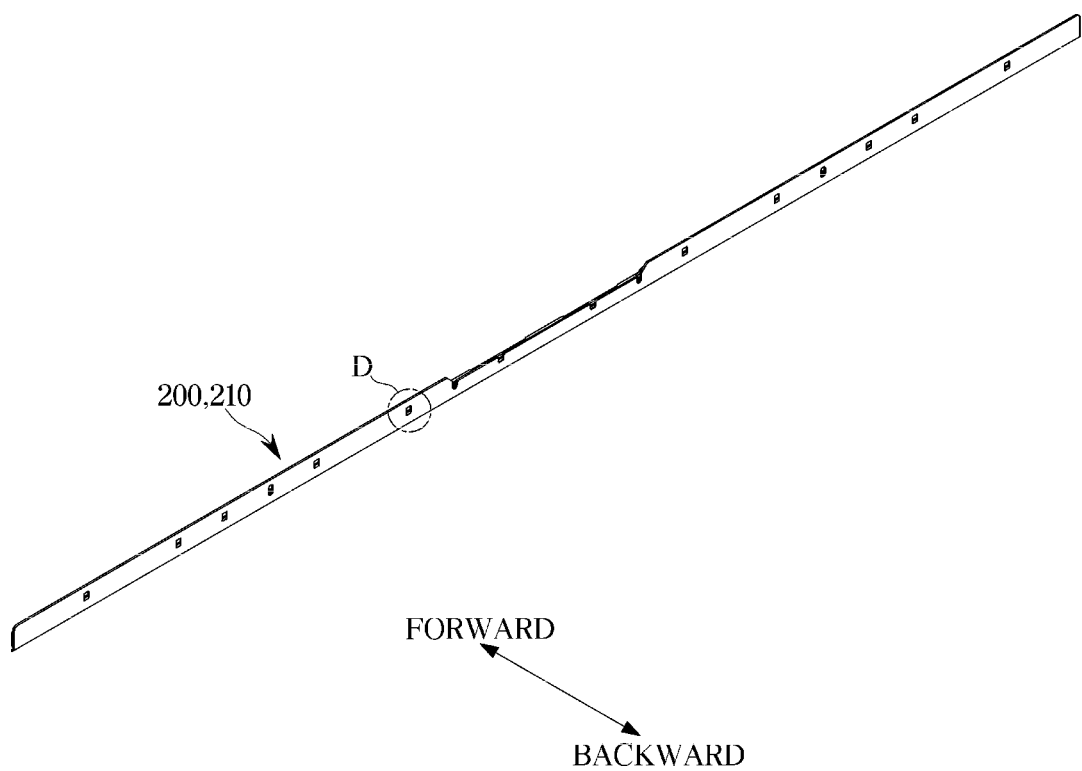
FIG. 22 is a view illustrating a state in which a panel holder and a support frame shown in FIG. 21 are coupled to each other.

FIG. 20 is a view illustrating a display panel and a rear chassis separated from a display apparatus according to an embodiment. FIG. 21 is a view separately illustrating a panel holder and a support frame in a display apparatus according to an embodiment. FIG. 22 is a view illustrating a state in which a panel holder and a support frame shown in FIG. 21 are coupled to each other.

In the following description, details of redundant description will be omitted.

Referring to FIGS. 20 to 22, a panel holder 200 and a support frame 210 according to an embodiment may be coupled to and separated from each other by sliding movement without a wire or a separate member.

More specifically, the panel holder 200 may be coupled to the support frame 210 by slidably moving with respect to the support frame 210 in the first direction. Conversely, the panel holder 200 may be separated from the support frame 210 by slidably moving with respect to the support frame 210 in the second direction opposite to the first direction. According to an embodiment, the first direction may refer to the downward direction, and the second direction may refer to the upward direction.

The panel holder 200 may be coupled to the lower end of the rear surface of the display panel 10. The support frame 210 may be coupled to the lower end of the front surface of the rear chassis 40. By moving the display panel 10 upward with respect to the rear chassis 40, the display panel 10 may be separated from the rear chassis 40 in the forward direction.

Figure 23:
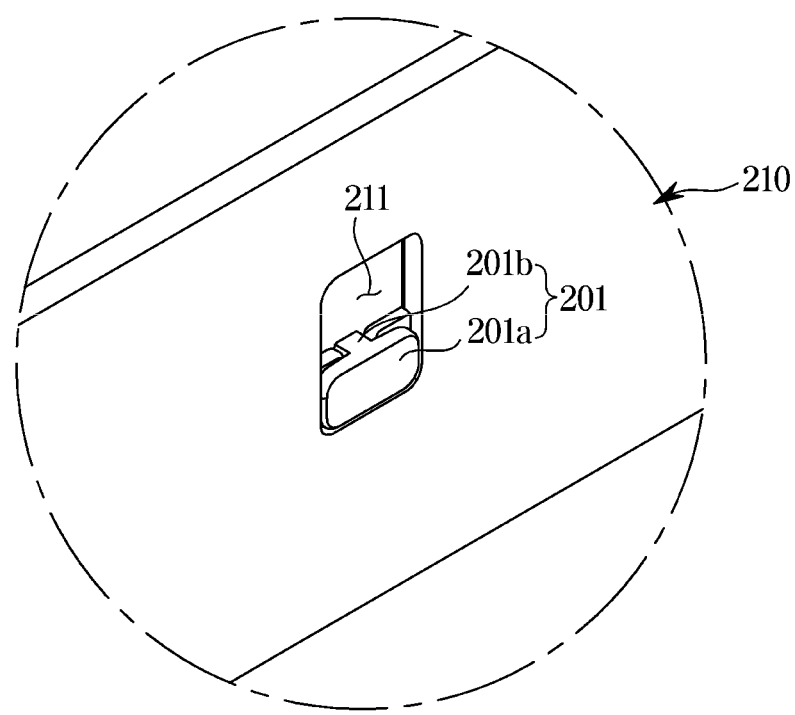
FIG. 23 is an enlarged view of portion D of FIG. 22, showing a state in which a panel holder and a support frame are coupled to each other.
Figure 24:
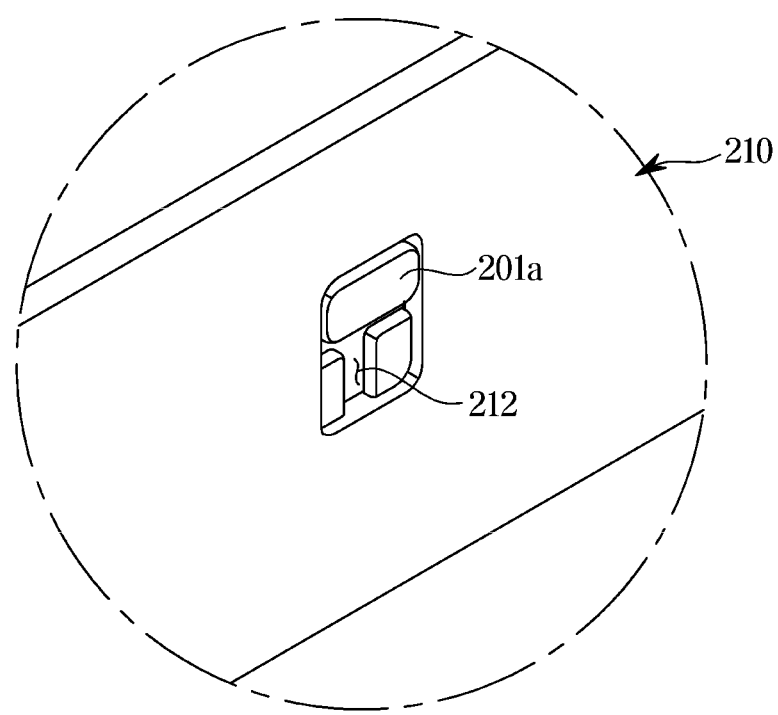
FIG. 24 is an enlarged view of portion D of FIG. 22, showing a state in which a panel holder and a support frame are in a state of being separable from each other.
Figure 25:
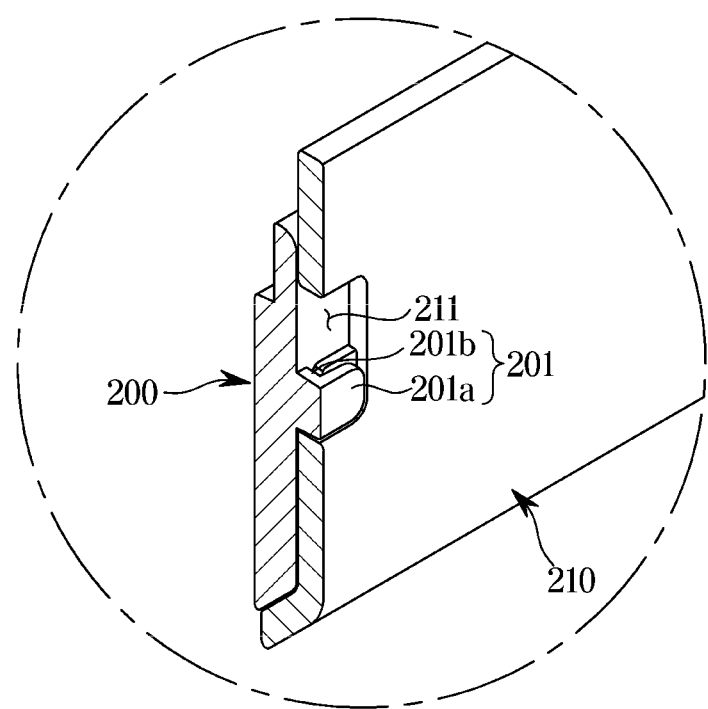
FIG. 25 is a cross-sectional perspective view of FIG. 23.
Figure 26:
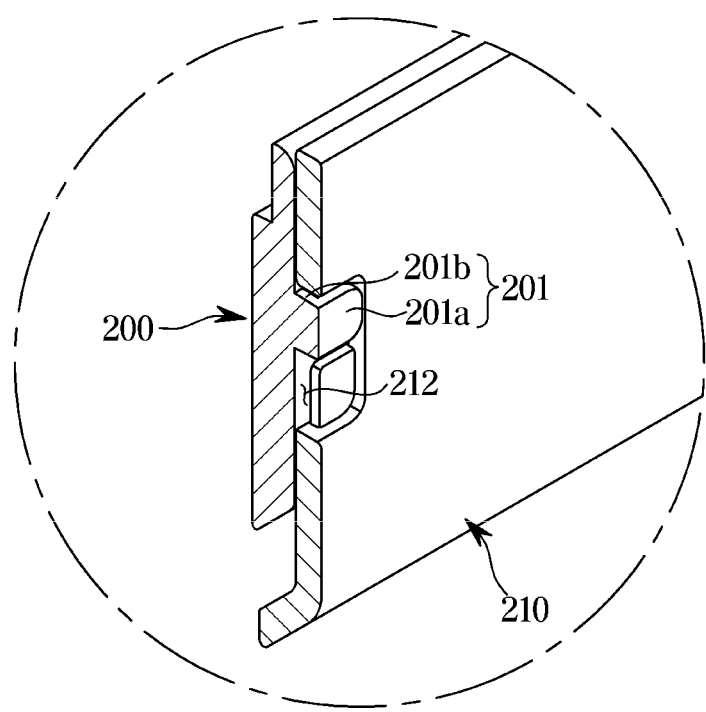
FIG. 26 is a cross-sectional perspective view of FIG. 24.

FIG. 23 is an enlarged view of portion D of FIG. 22, showing a state in which a panel holder and a support frame are coupled to each other. FIG. 24 is an enlarged view of portion D of FIG. 22, showing a state in which a panel holder and a support frame are in a state of being separable from each other. FIG. 25 is a cross-sectional perspective view of FIG. 23. FIG. 26 is a cross-sectional perspective view of FIG. 24.

Referring to FIGS. 23 to 26, the panel holder 200 according to an embodiment may include coupling protrusions 201 protruding toward the support frame 210. The coupling protrusions 201 include a head portion 201A having a first area and a connecting portion 201B having a second area smaller than the first area and connecting the head portion 201 to the panel holder 200.

The support frame 210 may include a first hole 211 having an area larger than the first area so that the head portion 201A of the panel holder 200 may pass through the first hole 211, and a second hole 212 having an area smaller than the first area and larger than the second area. The first hole 211 and the second hole 212 may be consecutively arranged in the vertical direction.

With the above structure, the head portion 201A of the coupling protrusions 201 may be inserted into the first hole 211. The head portion 201A inserted into the first hole 211 may slide downward. When the head portion 201A slides downward, the connecting portion 201B is inserted into the second hole 212, and because the head portion 201A does not pass through the second hole 212, the panel holder 200 and the support frame 210 may be coupled to each other.

Conversely, when the panel holder 200 slides upward with the connecting portion 201B inserted into the second hole 212, the connecting portion 201B is drawn out of the second hole 212, and the head portion 201A is inserted into the first hole 211, so that the panel holder 200 may be separable from the support frame 210 in the forward direction.

As is apparent from the above description, a display apparatus including a display panel that is allowed to be disassembled and replaced without damage can be provided.

A display apparatus having an ultra-slim appearance can be provided by reducing the size of a rear cover, which is the thickest part of the display apparatus.

A display apparatus allowing a display panel, of which a rear surface is coupled to a substrate, to be detachably coupled to a rear chassis can be provided.

Although the disclosure has been shown and described in relation to specific embodiments, it would be appreciated by those skilled in the art that changes and modifications may be made in these embodiments without departing from the principles and scope of the disclosure, the scope of which is defined in the claims and their equivalents.

What is claimed is:

1. A display apparatus comprising:
a display panel;
a rear chassis covering a rear surface of the display panel;
a support frame coupled to the rear chassis;
a panel holder provided on the rear surface of the display panel to face the support frame, the panel holder being configured to be coupled to the support frame to attach the display panel to the rear chassis; and
a wire configured to:
couple the panel holder to the support frame based on the wire being coupled to the panel holder and the support frame, and
release the coupling between the panel holder and the support frame based on the wire being separated from the panel holder and the support frame,
wherein the rear chassis has a chassis hole formed therein and through which the wire passes, and
wherein the wire is drawn out of the rear chassis through the chassis hole from a rear side of the rear chassis to be separated from the panel holder and the support frame.

2. The display apparatus of claim 1, further comprising a rear cover coupled to the rear side of the rear chassis to cover a first portion of the rear chassis,
wherein the chassis hole is provided in the first portion of the rear chassis covered by the rear cover.

3. The display apparatus of claim 2, wherein a first end of the rear cover and a first end of the rear chassis are spaced apart from each other by a first distance, and
a second end of the rear cover and a second end of the rear chassis are spaced apart from each other by the first distance.

4. The display apparatus of claim 2, wherein a remaining portion of the rear chassis, other than the first portion of the rear chassis, forms a rear external appearance of the display apparatus.

5. The display apparatus of claim 1, further comprising a substrate configured to transmit a signal to drive the display panel and coupled to the rear surface of the display panel.

6. The display apparatus of claim 5, further comprising a film cable configured to connect the display panel to the substrate,
wherein the panel holder is attached to the rear surface of the display panel by an adhesive member provided on a lateral side of the film cable.

7. The display apparatus of claim 1, wherein, while the wire is coupled to the panel holder and the support frame, a first portion of the wire is supported by the panel holder, and a second portion of the wire spaced apart from the first portion is supported by the support frame to couple the panel holder and the support frame with each other.

8. The display apparatus of claim 7, wherein the panel holder and the support frame are restrained by a tension of the wire to restrict the panel holder and the support frame from moving away from each other in a first direction, and the wire is separated from the panel holder and the support frame by moving in a second direction intersecting the first direction.

9. The display apparatus of claim 8, wherein while the wire is separated from the panel holder and the support frame, the panel holder is moved a distance in a third direction intersecting the first direction and the second direction and then separated from the support frame in the first direction.

10. The display apparatus of claim 1, wherein the panel holder comprises:
a first panel holder provided adjacent to a lower end and a first side end of the display panel; and
a second panel holder provided adjacent to the lower end and a second side end of the display panel.

11. The display apparatus of claim 10, wherein the support frame comprises:
a first support frame provided adjacent to a lower end and a first side end of the rear chassis to correspond to the first panel holder; and
a second support frame provided adjacent to the lower end and a second side end of the rear chassis to correspond to the second panel holder.

12. The display apparatus of claim 1, wherein the display panel comprises:
a light-emissive panel configured to emit light and display an image; and
a heat dissipation sheet attached to a rear surface of the light-emissive panel and configured to dissipate heat.

13. The display apparatus of claim 12, wherein the heat dissipation sheet comprises at least one of graphite, aluminum or copper.

14. The display apparatus of claim 12, wherein the heat dissipation sheet is configured to be detachable from the rear chassis.

* * * * *